（12）United States Patent
Kwon et al.

(10) Patent No.: US 11,455,913 B2
(45) Date of Patent: Sep. 27, 2022

(54) DISPLAY DEVICE

(71) Applicant: LG Display Co., Ltd., Seoul (KR)

(72) Inventors: Hoiyong Kwon, Seoul (KR); JiHun Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 262 days.

(21) Appl. No.: 16/932,365

(22) Filed: Jul. 17, 2020

(65) Prior Publication Data
US 2021/0056872 A1    Feb. 25, 2021

(30) Foreign Application Priority Data

Aug. 22, 2019  (KR) ........................ 10-2019-0102988

(51) Int. Cl.
*G09F 9/30* (2006.01)
*H01L 51/52* (2006.01)
*H05K 1/18* (2006.01)

(52) U.S. Cl.
CPC .......... *G09F 9/301* (2013.01); *H01L 51/5246* (2013.01); *H05K 1/189* (2013.01); *H01L 2251/5338* (2013.01); *H05K 2201/051* (2013.01)

(58) Field of Classification Search
CPC .................. G09F 9/301; H01L 51/5246; H01L 2251/5338; H01L 51/0097; H05K 1/189; H05K 1/028; H05K 1/147; H05K 2201/10128; H05K 2201/051;
(Continued)

(56) References Cited

U.S. PATENT DOCUMENTS 7,196,692 B2 * 3/2007 Mochizuki ............ G06F 1/1601
                                                        345/905
9,756,757 B2    9/2017 Park et al.
9,870,029 B2    1/2018 Kim et al.
(Continued)

FOREIGN PATENT DOCUMENTS

CN    105408232 A    3/2016
CN    105741683 A    7/2016
(Continued)

OTHER PUBLICATIONS

First Office Action, China National Intellectual Property Administration Patent Application No. 202010766743.5, dated May 7, 2022, 22 pages.

*Primary Examiner* — Anne M Hines
*Assistant Examiner* — Jose M Diaz
(74) *Attorney, Agent, or Firm* — Fenwick & West LLP

(57)    ABSTRACT

A display device according to an exemplary embodiment of the present disclosure includes a display panel, a back cover which supports the display panel on a rear surface of the display panel, a plurality of flexible films which is electrically connected to one end of the display panel and is disposed on one surface of the back cover, a printed circuit board which is electrically connected to the plurality of flexible films and disposed on the one surface of the back cover, and a roller to which the display panel and the back cover are wound or unwound, and the roller includes a flat portion and a first curved portion and a second curved portion having different radii of curvature. Accordingly, the damage of the plurality of flexible films and the printed circuit board may be reduced.

20 Claims, 24 Drawing Sheets

(58) Field of Classification Search
CPC ... H05K 5/0239; Y02E 10/549; G06F 1/1652; G06F 2203/04102
See application file for complete search history.

(56) References Cited

U.S. PATENT DOCUMENTS

| | | | |
|---|---|---|---|
| 9,992,881 B2 | 6/2018 | Choi et al. | |
| 10,367,050 B2 | 7/2019 | Choi et al. | |
| 11,013,130 B2 | 5/2021 | Shin et al. | |
| 11,233,112 B2 | 1/2022 | Choi et al. | |
| 2010/0246113 A1* | 9/2010 | Visser | G09F 9/301 361/679.3 |
| 2011/0043976 A1* | 2/2011 | Visser | G09F 9/301 361/679.01 |
| 2013/0314762 A1* | 11/2013 | Kwack | G02F 1/09 359/280 |
| 2014/0362512 A1 | 12/2014 | Hinson | |
| 2016/0167903 A1 | 6/2016 | Hayashi | |
| 2016/0187929 A1* | 6/2016 | Kim | G06F 1/1643 345/184 |
| 2016/0374228 A1 | 12/2016 | Park et al. | |
| 2017/0332496 A1 | 11/2017 | Choi et al. | |
| 2017/0338294 A1 | 11/2017 | Choi et al. | |
| 2017/0367198 A1* | 12/2017 | Park | H04M 1/0268 |
| 2019/0333982 A1 | 10/2019 | Choi et al. | |
| 2020/0008308 A1 | 1/2020 | Shin et al. | |
| 2021/0176873 A1 | 6/2021 | Shin et al. | |

FOREIGN PATENT DOCUMENTS

| | | |
|---|---|---|
| CN | 106257569 A | 12/2016 |
| CN | 107369383 A | 11/2017 |
| CN | 107425036 A | 12/2017 |
| KR | 101945985 | 2/2019 |

* cited by examiner

DISPLAY DEVICE

CROSS-REFERENCE TO RELATED APPLICATIONS

This application claims the priority of Republic of Korea Patent Application No. 10-2019-0102988 filed on Aug. 22, 2019, in the Korean Intellectual Property Office, the disclosure of which is incorporated herein by reference in its entirety.

BACKGROUND

Field

The present disclosure relates to a display device, and more particularly, to a rollable display device which is capable of displaying images even in a rolled state.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display element and a wiring line on a flexible substrate such as plastic which is a flexible material so as to be capable of displaying images even though the display device is rolled is getting attention as a next generation display device.

SUMMARY

An object to be achieved by the present disclosure is to provide a display device which reduces a crack in a routing line area due to repeated winding and unwinding.

Another object to be achieved by the present disclosure is to provide a display device which increases a degree of freedom of a routing line area to reduce interference of a flexible film.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device includes a display panel, a back cover which supports the display panel on a rear surface of the display panel, a plurality of flexible films which is electrically connected to one end of the display panel and is disposed on one surface of the back cover, a printed circuit board which is electrically connected to the plurality of flexible films and disposed on the one surface of the back cover, and a roller to which the display panel and the back cover are wound or unwound, and the roller includes a flat portion and a first curved portion and a second curved portion having different radii of curvature.

According to another aspect of the present disclosure, a display device includes: a display panel, a plurality of flexible films which is electrically connected to the display panel; a printed circuit board which is electrically connected to the plurality of flexible films; a back cover which supports the display panel, the plurality of flexible films, and the printed circuit board and includes a plurality of openings; a first cover unit which covers the plurality of flexible films and a part of the back cover and a part of the display panel corresponding to the plurality of flexible films; a second cover unit which covers the printed circuit board and the other part of the back cover corresponding to the printed circuit board; and a roller to which the display panel and the back cover are wound and unwound, the roller includes a flat portion, a first curved portion, and a second curved portion, and even though the back cover is wound around the roller, a routing line area at a lower end of the display panel maintains a flat state.

Other detailed matters of the exemplary embodiments are included in the detailed description and the drawings.

According to the present disclosure, an outer circumferential surface of the roller is partially designed by an inner line and an outer line to maintain the routing line area to be flat even during the winding of the display device, thereby reducing a rolling crack in the routing line area.

According to the present disclosure, a chain cover is applied so that a degree of freedom is applied to the routing line area without compressing the display panel and the interference of the flexible film is reduced, thereby improving the tearing issue due to the tension of the flexible film.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
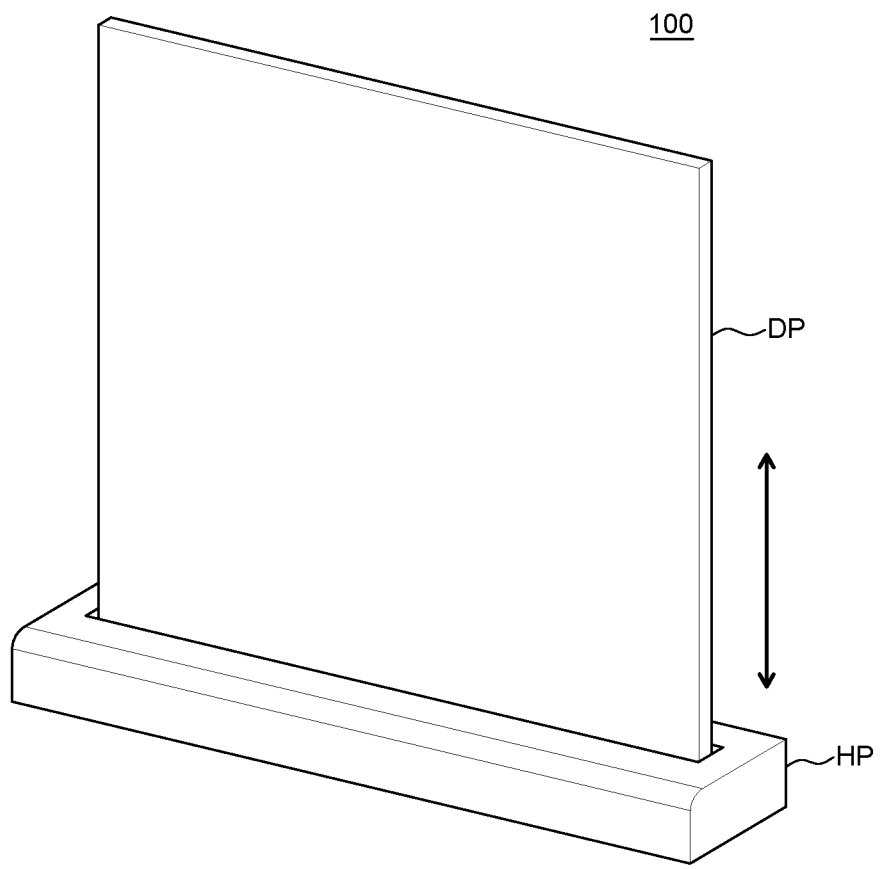
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Display Device-Rollable Display Device

A rollable display device may be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled again to be used.

Figure 1B:
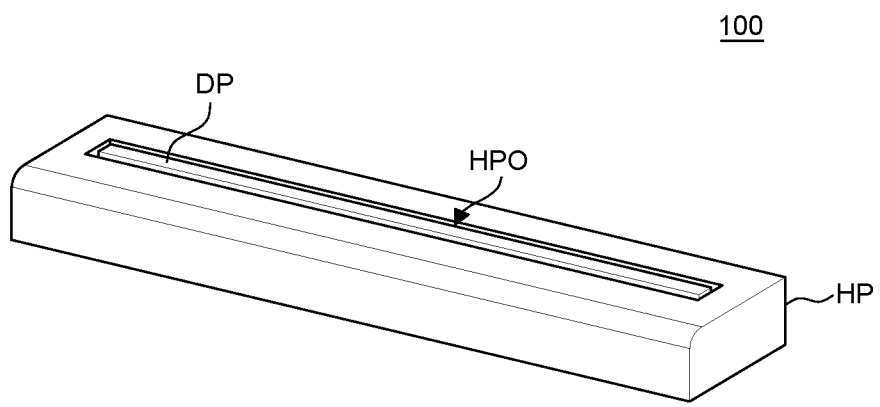

FIGS. 1A and 1B are perspective views of a display device according to an exemplary embodiment of the present disclosure. Referring to FIGS. 1A and 1B, a display device 100 according to an exemplary embodiment of the present disclosure may include a display unit DP and a housing unit HP.

The display unit DP is a configuration for displaying images to a user and for example, in the display unit DP, a display element and a circuit, a wiring line, and a component for driving the display element may be disposed.

Since the display device 100 according to the exemplary embodiment of the present disclosure is a rollable display device, the display unit DP may be configured to be wound or unwound. The display unit DP may be configured by a display panel and a back cover which have a flexibility to be wound or unwound. The display unit DP will be described below in more detail with reference to FIGS. 4 and 6.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO through which the display unit DP moves to the inside and the outside of the housing unit HP. The display unit DP may move in a vertical direction by passing through the opening HPO of the housing unit HP.

In the meantime, the display unit DP may be switched from a fully unwound state to a fully wound state or from a fully wound state to a fully unwound state.

FIG. 1A illustrates a fully unwound state of the display unit DP of the display device 100 and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates a fully wound state of the display unit DP of the display device 100 and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In the meantime, in order to switch the display unit DP to a fully unwound state or a fully wound state, a driving unit which winds or unwinds the display unit DP may be disposed.

Driving Unit

Figure 2:
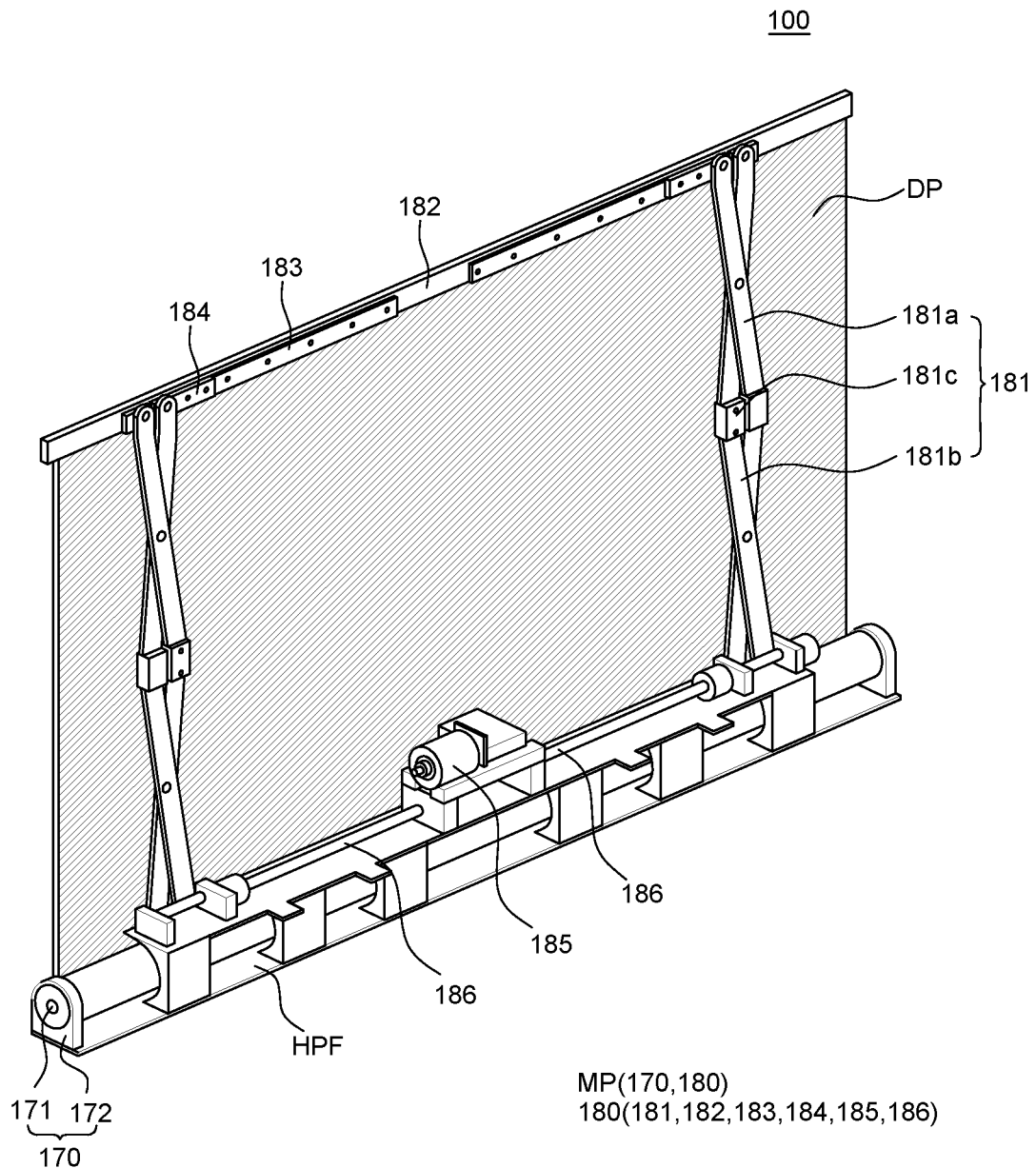
FIG. 2 is a perspective view of a display device according to an exemplary embodiment of the present disclosure.

FIG. 2 is a perspective view of a display device according to an exemplary embodiment of the present disclosure.

Figure 3:
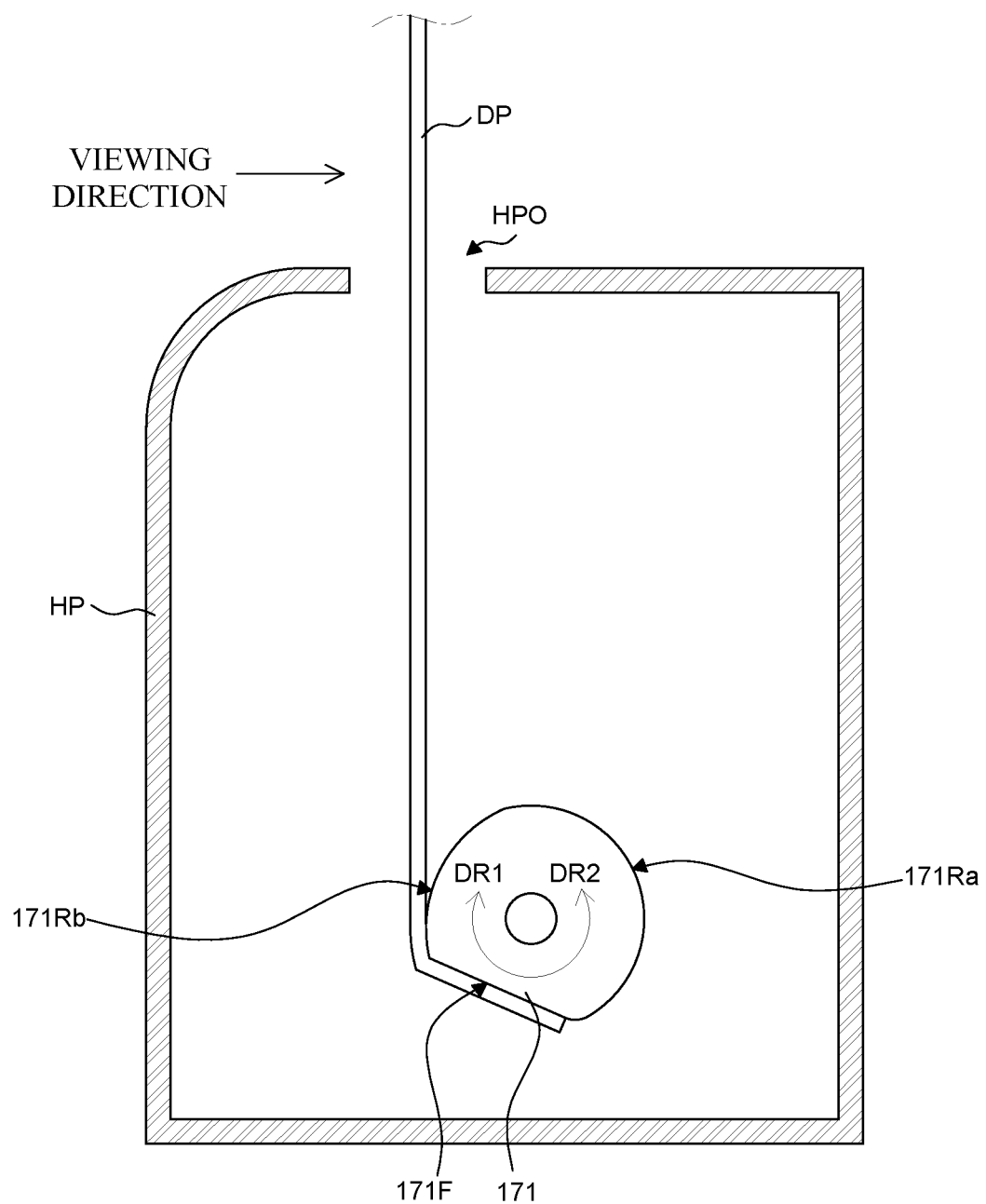
FIG. 3 is a schematic cross-sectional view of a display device according to an exemplary embodiment of the present disclosure.

FIG. 3 is a schematic cross-sectional view of a display device according to an exemplary embodiment of the present disclosure. FIG. 3 is a schematic cross-sectional view for explaining a roller 171 and a display unit DP of a display device 100 according to an exemplary embodiment of the present disclosure. For the convenience of description, in FIG. 3, only a housing unit HP, a roller 171, and a display unit DP are illustrated.

First, referring to FIG. 2, a driving unit MP may include a roller unit 170 and a lifting unit 180.

The roller unit 170 rotates in a clockwise direction or a counterclockwise direction to wind or unwind the display unit DP fixed to the roller unit 170. The roller unit 170 includes a roller 171 and a roller support unit 172.

The roller 171 is a member around which the display unit DP is wound. The roller 171 may be, for example, formed to have a cylindrical shape. A lower edge of the display unit DP may be fixed to the roller 171. When the roller 171 rotates, the display unit DP which is fixed to the roller 171 through the lower edge may be wound around the roller 171. In contrast, when the roller 171 rotates in an opposite direction, the display unit DP which is wound around the roller 171 may be unwound from the roller 171.

Referring to FIG. 3, the roller 171 may be formed to have a cylindrical shape in which a part of an outer circumferential surface of the roller 171 is flat and the remaining part of the outer circumferential surface is a curved portion. Even though the roller 171 may be entirely a cylindrical shape, but a part thereof may be formed of a flat surface. Further, the remaining part of the outer circumferential surface of the roller 171 may be configured by at least two curved surfaces. That is, a part of the outer circumferential surface of the roller 171 is formed to be flat and the remaining part of the outer circumferential surface may be configured by at least two curved surfaces having different radii of curvature. For example, the roller 171 may be configured by a flat portion 171F, a first curved portion 171Ra, and a second curved portion 171Rb and the printed circuit board 140 of the display unit DP is seated in the flat portion 171F. That is, according to the present disclosure, the outer circumferential surface of the roller 171 is partially designed by an outer line of the first curved portion 171Ra and an inner line of the second curved portion 171Rb to maintain the routing line area to be flat even during the repeated winding of the display device 100. By doing this, a rolling crack in the routing line area may be reduced. For reference, the routing line area refers to an area between the pad area and the display area where a link line is disposed.

The rolling crack is generated in an area between the tape automated bonding (TAB) to be spread to the TAB area. In the TAB area, the rolling crack spreads inwardly to approximately 3 to 4 mm. That is, when the rolling is performed once, the crack is generated in an area between TABs to spread to the TAB area and cause the disconnection of the routing line. Therefore, driving failure may be caused. It is estimated that as soon as a force which upwardly and downwardly pulls the display panel encounters the roller, the force is partially converted into a normal reaction force which outwardly pushes the display panel.

Therefore, according to the present disclosure, even though the display device 100 is repeatedly wound, a tangential state is maintained in the routing line area (that is, the routing line area is maintained to be flat) to derive the normal reaction force to be free state so that the crack generated in the related art may be suppressed. According to the present disclosure, it may be understood that the crack which is generated when the rolling is performed once in the related art is not generated.

However, the roller 171 may have a complete cylindrical shape or an arbitrary shape which may wind the display unit DP, but is not limited thereto. A winding process of the roller 171 configured by a flat portion 171F, a first curved portion 171Ra, and a second curved portion 171Rb and the display unit DP will be described below with reference to FIGS. 7A to 7D.

Referring to FIG. 2, the roller support unit 172 may support the roller 171 at both sides of the roller 171. Specifically, the roller support unit 172 is disposed on a bottom surface HPF of the housing unit HP and an upper side surface of the roller support unit 172 may be coupled to both side ends of the roller 171. By doing this, the roller support unit 172 may support the roller 171 to be spaced apart from the bottom surface HPF of the housing unit HP. The roller 171 may be rotatably coupled to the roller support unit 172.

The lifting unit 180 may move the display unit DP in a vertical direction in accordance with the driving of the roller unit 170. The lifting unit 180 may include a link unit 181, a head bar 182, a slide rail 183, a slider 184, a motor 185, and a rotary unit 186.

The link unit 181 of the lifting unit 180 may include a plurality of links 181a and 181b and a hinge unit 181c which connects the plurality of links 181a and 181b to each other. Specifically, the plurality of links 181a and 181b includes a first link 181a and a second link 181b, and the first link 181a and the second link 181b cross each other in the form of scissors to be rotatably fastened by means of the hinge unit 181c. When the link unit 181 moves in the vertical direction, the plurality of links 181a and 181b may rotate to be far away from each other or close to each other.

The head bar 182 of the lifting unit 180 is fixed to an uppermost end of the display unit DP. The head bar 182 is coupled to the link unit 181 to move the display unit DP in the vertical direction in accordance with the rotation of the plurality of links 181a and 181b of the link unit 181. That is, the display unit DP may move in a vertical direction by the head bar 182 and the link unit 181.

The head bar 182 covers only a part of a surface which is adjacent to an uppermost edge of the display unit DP so as not to hide an image displayed on the top surface of the display unit DP. The display unit DP and the head bar 182 may be fixed by a screw, but are not limited thereto.

The slide rail 183 of the lifting unit 180 provides a movement path of the plurality of links 181a and 181b. Some of the plurality of links 181a and 181b is rotatably fastened with the slide rail 183 so that the motion is guided along a trajectory of the slide rail 183. Some of the plurality of links 181*a* and 181*b* is fastened with the slider 184 which is movably provided along the slide rail 183 to move along a trajectory of the slide rail 183.

The motor 185 is connected to a power generating unit, such as a separate external power source or a built-in battery, to be supplied with the power. Further, the motor 185 generates a torque to provide a driving force to the rotary unit 186.

The rotary unit 186 is connected to the motor 185 to be configured to convert a rotational motion from the motor 185 into a linear reciprocating motion. That is, the rotational motion of the motor 185 may be converted into the linear reciprocating motion of a structure fixed to the rotary unit 186. For example, the rotary unit 186 may be implemented by a shaft and a ball screw including a nut which is fastened with the shaft, but is not limited thereto.

The motor 185 and the rotary unit 186 interwork with the link unit 181 to lift and lower the display unit DP. The link unit 181 is formed with a link structure to receive the driving force from the motor 185 and the rotary unit 186 to be repeatedly folded or unfolded.

When the display unit DP is wound, the motor 185 is driven so that the structure of the rotary unit 186 may perform a linear motion. That is, a part of the rotary unit 186 to which one end of the second link 181*b* is coupled may perform the linear motion. Therefore, one end of the second link 181*b* may move toward the motor 185 and the plurality of links 181*a* and 181*b* is folded so that the height of the link unit 181 may be reduced. Further, while the plurality of links 181*a* and 181*b* is folded, the head bar 182 coupled to the first link 181*a* is also lowered and one end of the display unit DP coupled to the head bar 182 is also lowered.

When the display unit DP is unwound, the motor 185 is driven so that the structure of the rotary unit 186 may perform linear motion. That is, a part of the rotary unit 186 to which one end of the second link 181*b* is coupled may perform the linear motion. Therefore, one end of the second link 181*b* may move to be away from the motor 185 and the plurality of links 181*a* and 181*b* is unfolded so that the height of the link unit 181 may be increased. Further, while the plurality of links 181*a* and 181*b* is unfolded, the head bar 182 coupled to the first link 181*a* is also lifted and one end of the display unit DP coupled to the head bar 182 is also lifted.

Accordingly, when the display unit DP is fully wound around the roller 171, the link unit 181 of the lifting unit 180 may maintain a folded state. That is, when the display unit DP is fully wound around the roller 171, the lifting unit 180 may have a smallest height. When the display unit DP is fully unwound, the link unit 181 of the lifting unit 180 may maintain an unfolded state. That is, when the display unit DP is fully unwound, the lifting unit 180 may have a largest height.

In the meantime, when the display unit DP is wound, the roller 171 may rotate and the display unit DP may be wound around the roller 171. For example, referring to FIG. 3, a lower edge of the display unit DP is coupled to the roller 171. When the roller 171 rotates in a second direction DR2, that is, a counterclockwise direction, the display unit DP may be wound while a rear surface of the display unit DP is in close contact with the top surface of the roller 171.

On the other hand, when the display unit DP is unwound, the roller 171 may rotate and the display unit DP may be unwound from the roller 171. For example, referring to FIG. 3, when the roller 171 rotates in a first direction DR1, that is, in a clockwise direction, the display unit DP which is wound around the roller 171 is unwound from the roller 171 to be disposed at the outside of the housing unit HP.

In some exemplary embodiments, a driving unit MP having another structure other than the above-described driving unit MP may be applied to the display device 100. That is, as long as the display unit DP is wound and unwound, the above-described configuration of the roller unit 170 and the lifting unit 180 may be modified, some configurations may be omitted, or another configuration may be added.

Display Unit

Figure 4:
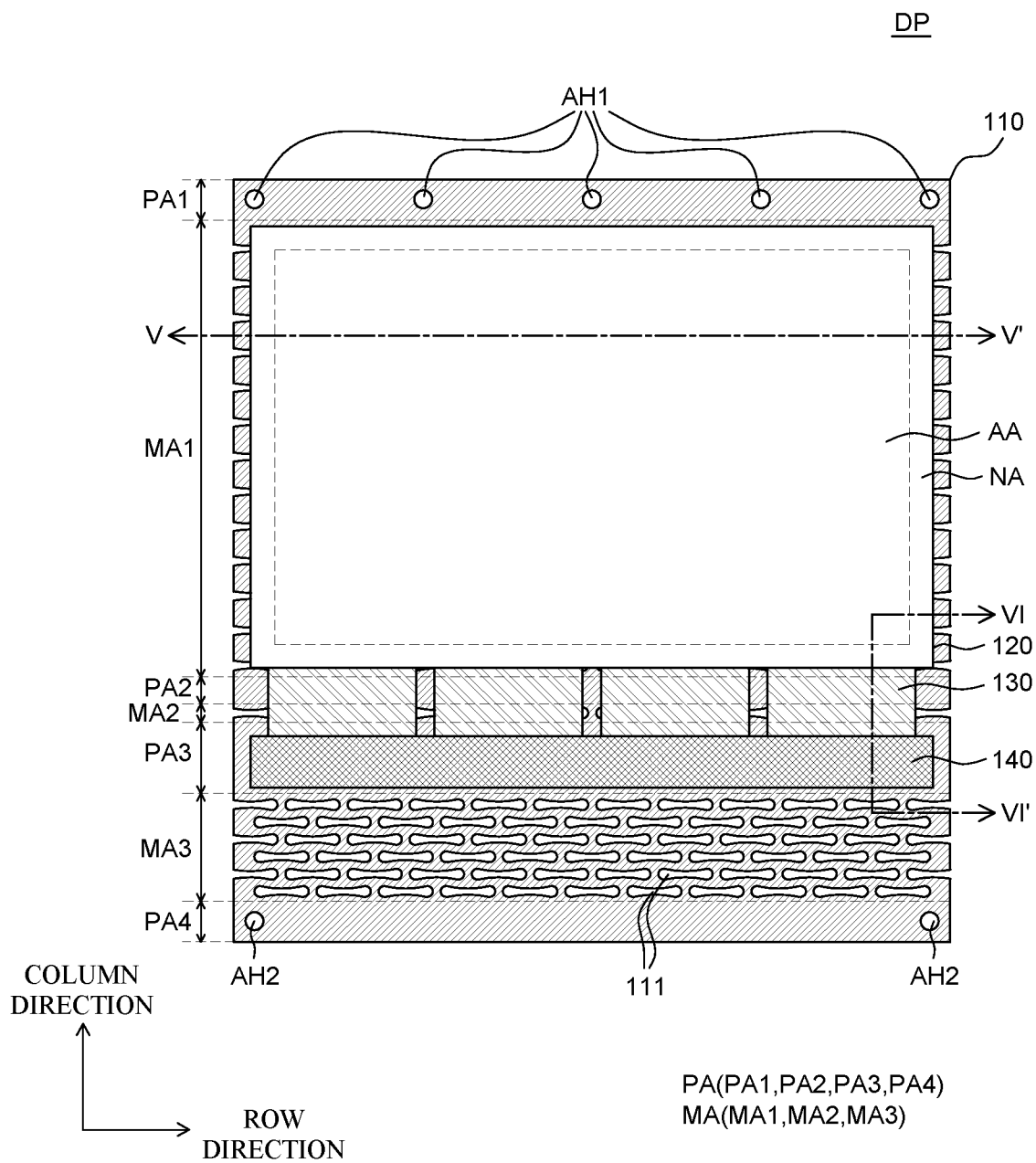
FIG. 4 is a plan view of a display unit of a display device according to an exemplary embodiment of the present disclosure.

FIG. 4 is a plan view of a display unit of a display device according to an exemplary embodiment of the present disclosure.

Figure 5:
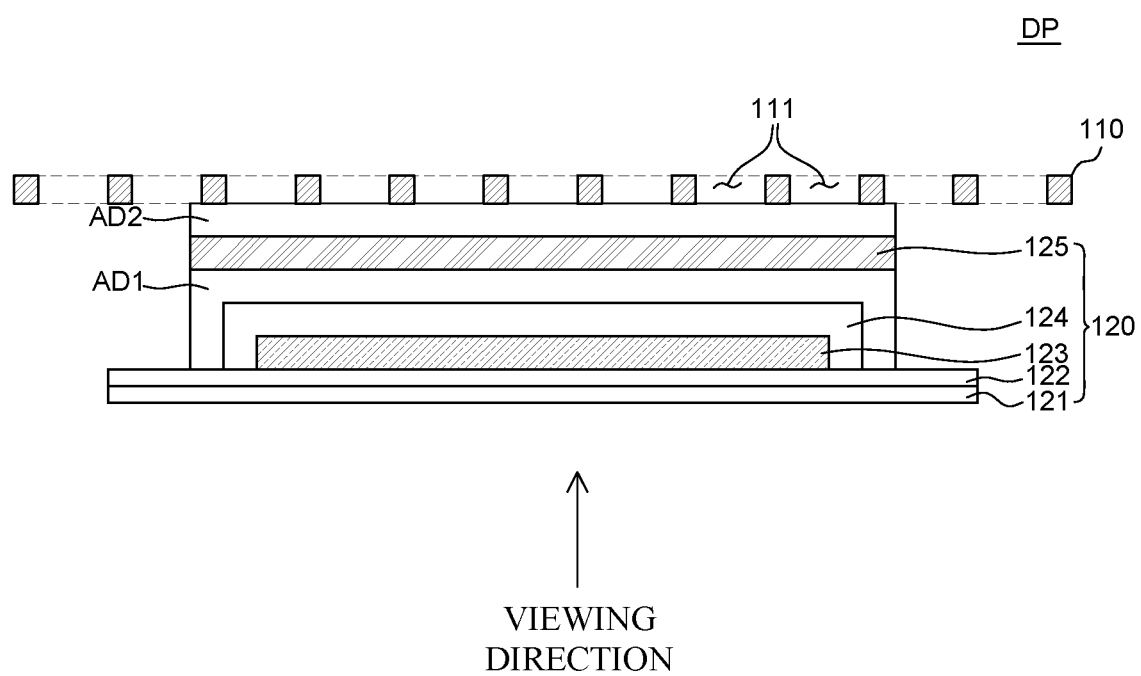
FIG. 5 is a cross-sectional view taken along the line V-V' of FIG. 4 according to an exemplary embodiment of the present disclosure.

FIG. 5 is a cross-sectional view taken along the line V-V' of FIG. 4 according to an exemplary embodiment of the present disclosure.

Figure 6:
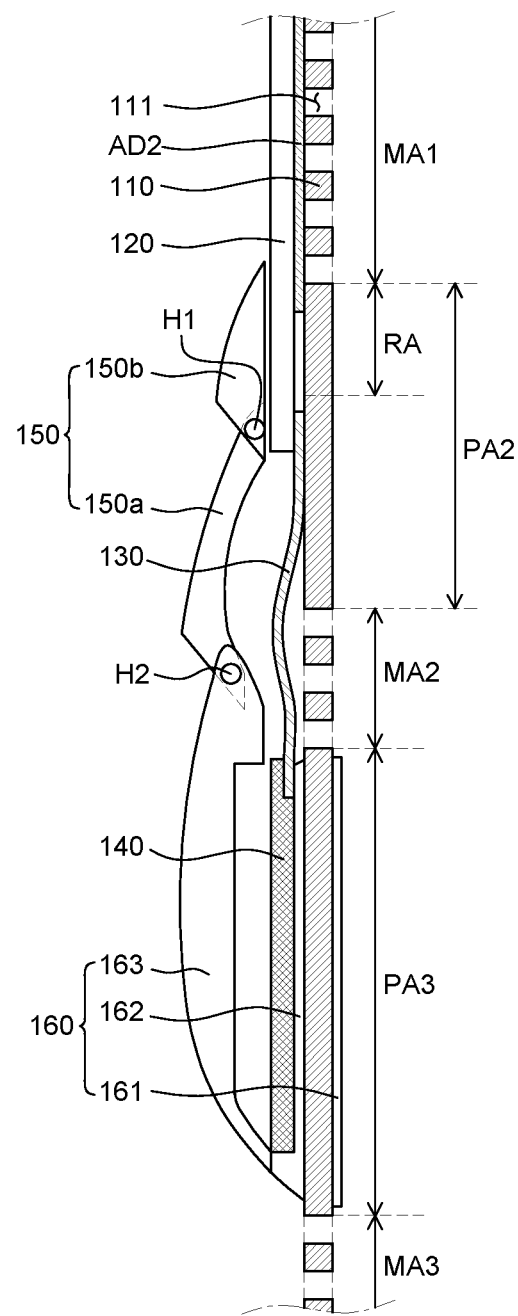
FIG. 6 is a cross-sectional view taken along the line VI-VI' of FIG. 4 according to an exemplary embodiment of the present disclosure.

FIG. 6 is a cross-sectional view taken along the line VI-VI' of FIG. 4 according to an exemplary embodiment of the present disclosure.

Referring to FIGS. 4 to 6, the display unit DP includes a back cover 110, a display panel 120, a flexible film 130, a printed circuit board 140, a first cover unit 150, and a second cover unit 160. In FIG. 4, for the convenience of description, the first cover unit 150 and the second cover unit 160 are not illustrated.

Referring to FIG. 4, the back cover 110 is disposed on a rear surface of the display panel 120 to support the display panel 120, the plurality of flexible films 130, and the printed circuit board 140. A size of the back cover 110 may be larger than a size of the display panel 120. The back cover 110 may protect other configurations of the display unit DP from the outside.

Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar or plastic. However, if the material of the back cover 110 satisfies physical conditions such as a thermal strain amount, a radius of curvature, and a rigidity, the material may be diversely changed depending on the design, and is not limited thereto.

The back cover 110 includes a plurality of support areas PA and a plurality of malleable areas MA. The plurality of support areas PA is areas where a plurality of openings 111 is not disposed and the plurality of malleable areas MA is areas where a plurality of openings 111 is disposed. Specifically, a first support area PA1, a first malleable area MA1, a second support area PA2, a second malleable area MA2, a third support area PA3, a third malleable area MA3, and a fourth support area PA4 are sequentially disposed from the uppermost end of the back cover 110, but the present disclosure is not limited thereto.

Since the back cover 110 is wound or unwound in a column direction, the plurality of support areas PA and the plurality of malleable areas MA may be disposed along the column direction.

The first support area PA1 is an uppermost area of the back cover 110 and is fastened with the head bar 182. The first support area PA1 includes first fastening holes AH1 to be fastened with the head bar 182. For example, the head bar 182 is fastened with the first support area PA1 of the back cover 110 through screws which pass through the head bar 182 and the first fastening holes AH1. As the first support area PA1 is fastened with the head bar 182, when the link unit 181 which is fastened with the head bar 182 is lifted or lowered, the back cover 110 is also lifted and lowered together with the display panel 120 which is attached to the back cover 110. Even though five first fastening holes AH1 are illustrated in FIG. 4, the number of first fastening holes AH1 is not limited thereto. Further, even though in FIG. 4, it has been described that the back cover 110 is fastened with the head bar 182 using the first fastening holes AH1, it is not limited thereto and the back cover 110 and the head bar 182 may be fastened with each other without using a separate fastening hole.

The first malleable area MA1 is an area extending from the first support area PA1 to a lower side of the back cover 110. The first malleable area MA1 is an area in which a plurality of openings 111 is disposed and the display panel 120 is attached. Specifically, the first malleable area MA1 is an area which is wound around or unwound from the roller 171 together with the display panel 120. The first malleable area MA1 may overlap at least the display panel 120 among other configurations of the display unit DP.

The second support area PA2 extends from the first malleable area MA1 to the lower side of the back cover 110. The plurality of flexible films 130 which is coupled to one end of the display panel 120 may be disposed in the second support area PA2.

Further, the third support area PA3 is an area extending from the second malleable area MA2 to the lower side of the back cover 110. The printed circuit board 140 may be disposed in the third support area PA3.

In order to protect the plurality of flexible films 130 and the printed circuit board 140, the second support area PA2 and the third support area PA3 may support the plurality of flexible films 130 and the printed circuit board 140 to be maintained to be flat without being bent to the roller 171.

According to the present disclosure, when the third support area PA3 is wound around the roller 171, a part of the outer circumferential surface of the roller 171 which is in contact with the third support area PA3 may be configured by a flat surface, that is, a flat portion 171F. By doing this, the printed circuit board 140 is maintained to be flat without being bent to the roller 171. Further, according to the present disclosure, when the second support area PA2 is wound around the roller 171, an empty space may be formed between the first cover unit 150 and the second support area PA2 to reduce the interference of the plurality of flexible films 130. That is, the empty space is formed between the first cover unit 150 and the second support area PA2 so that even though the first cover unit 150 is wound around the roller 171, the first cover unit 150 and the flexible film 130 are not pressed by the wound display unit DP. Therefore, the flexible films 130 may be maintained to be flat and the interference of the flexible films 130 may be reduced. To this end, the outer circumferential surface of the roller 171 is partially designed by an outer line of the first curved portion 171Ra and an inner line of the second curved portion 171Rb having a radius of curvature which is smaller than a radius of curvature of the outer line. Further, when the display unit DP is wound, the first cover unit 150 is wound so as to correspond to the second curved portion 171Rb.

Accordingly, the second support area PA2 and the third support area PA3 may be maintained to be flat regardless of being wound or unwound to the roller 171 and the plurality of flexible films 130 and the printed circuit board 140 disposed in the second support area PA2 and the third support area PA3 may also be maintained to be flat.

The second malleable area MA2 is an area disposed between the second support area PA2 and the third support area PA3. A plurality of openings 111 may be disposed in the second malleable area MA2. The second malleable area MA2 is an area disposed between the second support area PA2 and the third support area PA3 to allow the second support area PA2 and the third support area PA3 to be wound around the flat portion 171F and the second curved portion 171Rb of the outer circumferential surface of the roller 171, respectively.

Further, the third malleable area MA3 is an area extending from the third support area PA3 to the lower side of the back cover 110. A plurality of openings 111 may be disposed in the third malleable area MA3. The third malleable area MA3 is an area extending to dispose the display area AA of the display panel 120 at the outside of the housing unit HP. For example, when the back cover 110 and the display panel 120 are fully unwound, an area from the fourth support area PA4 of the back cover 110 which is fixed to the roller 171 to the second support area PA2 in which the plurality of flexible films 130 is disposed may be disposed in the housing unit HP. The first malleable area MA1 to which the display panel 120 is attached and the first support area PA1 may be disposed at the outside of the housing unit HP. That is, when the display panel 120 is fully unwound, the fourth support area PA4 fixed to the roller 171, the third malleable area MA3, the third support area PA3, the second malleable area MA2, and the second support area PA2 extending from the fourth support area PA4 may be disposed in the housing unit HP.

If a length from the fourth support area PA4 to the second support area PA2 is smaller than a length from the fourth support area PA4 to the opening HPO of the housing unit HP, a part of the first malleable area MA1 to which the display panel 120 is attached may be disposed in the housing unit HP. Further, a part of a lower end of the display area AA of the display panel 120 is disposed in the housing unit HP so that there may be a difficulty in watching images. Therefore, the length from the fourth support area PA4 fixed to the roller 171 to the third malleable area MA3, the third support area PA3, the second malleable area MA2, and the second support area PA2 may be designed to be equal to the length from the fourth support area PA4 fixed to the roller 171 to the opening HPO of the housing unit HP.

The fourth support area PA4 is an area extending from the third malleable area MA3 to the lower side of the back cover 110. The fourth support area PA4 is a lowermost area of the back cover 110 and is fastened with the roller 171. The fourth support area PA4 may include second fastening holes AH2 to be fastened with the roller 171. For example, screws which pass through the roller 171 and the second fastening holes AH2 are disposed to fasten the roller 171 and the fourth support area PA4 of the back cover 110 with each other. As the fourth support area PA4 is fastened with the roller 171, the back cover 110 may be wound around or unwound from the roller 171. Even though two second fastening holes AH2 are illustrated in FIG. 4, the number of second fastening holes AH2 is not limited thereto.

In the meantime, in the first support area PA1, the second support area PA2, the third support area PA3, and the fourth support area PA4, the plurality of openings 111 as formed in the plurality of malleable areas MA is not formed. Specifically, the first fastening holes AH1 are formed in the first support area PA1 and the second fastening holes AH2 are formed in the second support area PA2, but the plurality of openings 111 as formed in the plurality of malleable areas MA is not formed in the first support area PA1, the second support area PA2, the third support area PA3, and the fourth support area PA4. Further, the first fastening holes AH1 and the second fastening holes AH2 have different shapes from that of the plurality of openings 111. The first support area PA1 is an area fixed to the head bar 182, the second support area PA2 is an area where the plurality of flexible films 130 is supported, the third support area PA3 is an area where the printed circuit board 140 is supported, and the fourth support area PA4 is an area fixed to the roller 171. Therefore, the support areas may have a rigidity larger than that of the plurality of malleable areas MA.

As the first support area PA1, the second support area PA2, the third support area PA3, and the fourth support area PA4 have the rigidity, the first support area PA1 and the fourth support area PA4 may be firmly fixed to the head bar 182 and the roller 171. The second support area PA2 and the third support area PA3 maintain the plurality of flexible films 130 and the printed circuit board 140 to be flat so as not to be bent, thereby protecting the plurality of flexible films 130 and the printed circuit board 140. Therefore, the display unit DP is fixed to the roller 171 and the head bar 182 of the driving unit MP to move to the inside or the outside of the housing unit HP and protect the plurality of flexible films 130 and the printed circuit board 140.

In the meantime, in FIG. 4, for example, even though it is illustrated that the plurality of support areas PA and the plurality of malleable areas MA of back cover 110 are sequentially disposed along the column direction, when the back cover 110 is wound in the row direction, the plurality of support areas PA and the plurality of malleable areas MA may be disposed along the row direction.

When the display unit DP is wound or unwound, the plurality of openings 111 disposed in the plurality of malleable areas MA of the back cover 110 may be deformed by a stress which is applied to the display unit DP. Specifically, when the display unit DP is wound or unwound, the plurality of malleable areas MA of the back cover 110 may be deformed as the plurality of openings 111 contracts or expands. Further, as the plurality of openings 111 contracts or expands, a slip phenomenon of the display panel 120 disposed on the plurality of malleable areas MA of the back cover 110 is reduced so that the stress which is applied to the display panel 120 may be reduced.

In the meantime, when the display panel 120 and the back cover 110 are wound, a difference between a length of the display panel 120 which is wound around the roller 171 and a length of the back cover 110 which is wound around the roller 171 may be caused due to the difference of radii of curvature of the display panel 120 and the back cover 110. For example, when the back cover 110 and the display panel 120 are wound around the roller 171, a length of the back cover 110 required for wound around the roller 171 once may be different from a length of the display panel 120 required for being wound around the roller 171 once. That is, since the display panel 120 is disposed outer than the back cover 110 with respect to the roller 171, a length of the display panel 120 required to be wound around the roller 171 once may be larger than a length of the back cover 110 required to be wound around the roller 171 once. As described above, the winding lengths of the back cover 110 and the display panel 120 are different from each other due to the difference of radii of curvature at the time of winding the display unit DP and the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or defects such as cracks may be caused.

In the display device 100 according to an exemplary embodiment of the present disclosure, even though the display unit DP is wound or unwound and a stress is applied to the display unit DP, the plurality of openings 111 of the back cover 110 is flexibly deformed to alleviate the stress applied to the back cover 110 and the display panel 120. For example, when the back cover 110 and the display panel 120 are wound around the roller 171 along the column direction, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, a stress which is applied to the display panel 120 from the back cover 110 due to the deformation of the plurality of openings 111 when the back cover 110 and the display panel 120 are wound may also be alleviated.

Referring to FIG. 4, the display panel 120 is disposed on one surface of the back cover 110. For example, the display panel 120 is disposed in the first malleable area MA1, on one surface of the back cover 110.

The display panel 120 is a panel for displaying images to a user. The display panel 120 may include a display element which displays images, a driving element which drives the display element, and wiring lines which transmit various signals to the display element and the driving element.

The display element may be defined in different manners depending on the type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel as an example, the display panel 120 is not limited to the organic light emitting display panel. Further, since the display device 100 according to the exemplary embodiment of the present disclosure is a rollable display device, the display panel 120 may be implemented as a flexible display panel to be wound around or unwound from the roller 171.

Referring to FIG. 4, the display panel 120 may include a display area AA and a non-display area NA.

The display area AA is an area where images are displayed in the display panel 120. In the display area AA, a plurality of sub pixels which configures the plurality of pixels and a driving circuit for driving the plurality of sub pixels may be disposed. Each of the plurality of sub pixels is minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a driving circuit for driving the plurality of sub pixels may include a driving element and a wiring line. For example, the driving circuit may be configured by a thin film transistor, a storage capacitor, a gate line, and a data line, but is not limited thereto.

The non-display area NA is an area where no image is displayed. In the non-display area NA, various wiring lines and circuits for driving the organic light emitting diode of the display area AA are disposed. For example, in the non-display area NA, a link line which transmits signals to the plurality of sub pixels and driving circuits of the display area AA or a driving IC such as a gate driver IC or a data driver IC may be disposed, but the non-display area is not limited thereto. The routing line area may be located in the non-display area NA below the display panel 120.

Referring to FIG. 5, the display panel 120 may include a substrate 121, a buffer layer 122, a pixel unit 123, an encapsulating layer 124, and an encapsulating substrate 125.

The substrate 121 is a base member which supports various components of the display panel 120 and may be configured by an insulating material. The substrate 121 may be formed of a material having flexibility so that the display panel 120 is wound or unwound. For example, the substrate 121 may be formed of a plastic material such as polyimide PI.

The buffer layer 122 is disposed on the substrate 121. The buffer layer 122 suppresses moisture and/or oxygen which penetrates from the outside of the substrate 121 from being spread. The buffer layer 122 may be formed of an inorganic material, for example, may be configured by a single layer or a double layer of silicon oxide SiOx and silicon nitride SiNx, but is not limited thereto.

The pixel unit 123 is disposed on the substrate 121 and a top surface of the buffer layer 122. The pixel unit 123 may include a plurality of organic light emitting diodes and a circuit for driving the organic light emitting diodes. The pixel unit 123 may be disposed so as to correspond to the display area AA.

The display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed of a transparent conductive material to allow the light emitted from the organic light emitting diode to travel to the lower portion of the substrate 121 and the cathode may be formed of the metal material having a high reflectance.

Hereinafter, for the convenience of description, the description will be made by assuming that the display device 100 according to an exemplary embodiment of the present disclosure is a bottom emission type display device, but it is not limited thereto.

The encapsulating layer 124 may be disposed to cover the pixel unit 123.

The encapsulating layer 124 seals the organic light emitting diode of the pixel unit 123. The encapsulating layer 124 may protect the organic light emitting diode of the pixel unit 123 from moisture, oxygen, and impacts of the outside. The encapsulating layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy-based or acrylic-based polymer, but they are not limited thereto.

The encapsulating substrate 125 is disposed on the encapsulating layer 124. Specifically, the encapsulating substrate 125 is disposed between the encapsulating layer 124 and the back cover 110. The encapsulating substrate 125 protects the organic light emitting diode of the pixel unit 123 together with the encapsulating layer 124. The encapsulating substrate 125 may protect the organic light emitting diode of the pixel unit 123 from moisture, oxygen, and impacts of the outside. For example, the encapsulating substrate 125 may be formed of a material having a high modulus of approximately 200 to 900 MPa. The encapsulating substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulating substrate 125 is formed of a metal material, the encapsulating substrate 125 may be implemented as an ultra-thin film and provide a strong resistance against external impacts and scratches.

A first adhesive layer AD1 may be disposed between the encapsulating layer 124 and the encapsulating substrate 125. The first adhesive layer AD1 may bond the encapsulating layer 124 and the encapsulating substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed so as to enclose the encapsulating layer 124 and the pixel unit 123. That is, the pixel unit 123 may be sealed by the buffer layer 122 and the encapsulating layer 124 and the encapsulating layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulating layer 124 and the encapsulating substrate 125. In this case, the first adhesive layer AD1 may further include an absorbent. The absorbent may be particles having hygroscopicity and absorb moisture and oxygen from the outside to reduce permeation of the moisture and oxygen into the pixel unit 123.

A second adhesive layer AD2 may be disposed between the encapsulating substrate 125 and the back cover 110. The second adhesive layer AD2 may bond the encapsulating substrate 125 and the back cover 110 to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA), but is not limited thereto.

Even though in FIG. 5, it is illustrated that the plurality of openings 111 of the back cover 110 is not filled with the second adhesive layer AD2, the second adhesive layer AD2 may be filled in some or all of the plurality of openings 111 of the back cover 110. If the second adhesive layer AD2 is filled inside the plurality of openings 111 of the back cover 110, a contact area between the second adhesive layer AD2 and the back cover 110 is increased so that a separation phenomenon between the second adhesive layer AD2 and the back cover 110 may be avoided.

In the meantime, referring to FIG. 6, in the present disclosure, the second adhesive layer AD2 may not be applied to the routing line area RA and the pad area. According to the related art, the second adhesive layer is applied to the back cover and the front surface of the display panel so that when the back cover is wound around the roller, the display panel is wound around the roller. However, when the second adhesive layer AD2 is not applied to the routing line area RA and the pad area as described in the present disclosure, even though the back cover 110 which matches the corresponding section is wound around the roller 171, a part of the display panel, that is, the routing line area RA and the pad area may be maintained to be flat.

Widths of the routing line area RA and the pad area are approximately 10 mm and the second adhesive layer AD2 may not be applied only to the lower end of the display area AA so that the routing line area and the pad area are not visible with naked eye from the front surface.

Even though not illustrated in the drawing, a polarizing plate may be disposed on a rear surface of the display panel 120. The polarizing plate selectively transmits light to reduce the reflection of external light which is incident onto the display panel 120. Specifically, the display panel 120 may include various metal materials applied to the semiconductor element, the wiring line, and the organic light emitting diode. Therefore, the external light incident onto the display panel 120 may be reflected from the metal material so that the visibility of the display device 100 may be reduced due to the reflection of the external light. Therefore, when the polarizing plate is disposed, the polarizing plate suppresses the reflection of the external light to increase the outdoor visibility of the display device 100. However, the polarizing plate may be omitted depending on an implementation embodiment of the display device 100.

Referring to FIG. 4 again, the plurality of flexible films 130 is disposed in the second support area PA2 of the back cover 110. The plurality of flexible films 130 is films in which various components are disposed on a base film having a malleability and supplies a signal to the plurality of sub pixels and the driving circuits which configure the plurality of pixels of the display area AA and is electrically connected to the display panel 120. One ends of the plurality of flexible films 130 are disposed in the non-display area NA of the display panel 120 to supply a power voltage or a data voltage to the plurality of sub pixels and the driving circuits of the display area AA. In the meantime, even though the plurality of flexible films 130 is four in FIG. 4, the number of the plurality of flexible films 130 may vary depending on the design, but is not limited thereto.

A driving IC such as a gate driver IC or a data driver IC may be disposed on the plurality of flexible films 130. The driving IC is a component which processes data for displaying images and a driving signal for processing the data. The driving IC may be disposed by a chip on glass (COG), a chip on film (COF), or a tape carrier package (TCP) depending on a mounting method. However, for the convenience of description, it is described that the driving IC is mounted on the plurality of flexible films 130 by a chip on film technique, but is not limited thereto.

The printed circuit board 140 is disposed in the third support area PA3 of the back cover 110 to be coupled to the plurality of flexible films 130. The printed circuit board 140 is a component which supplies signals to the driving IC. Various components may be disposed in the printed circuit board 140 to supply various signals such as a driving signal or a data signal to the driving IC. In the meantime, even though one printed circuit board 140 is illustrated in FIG. 4, the number of printed circuit boards 140 may vary depending on the design and is not limited thereto.

Even though not illustrated in FIG. 4, an additional printed circuit board 140 which is coupled to the printed circuit board 140 may be further disposed. For example, the printed circuit board 140 may be referred to as a source printed circuit board S-PCB (Source PCB) on which the data driver is mounted and the additional printed circuit board connected to the printed circuit board 140 may be referred to as a control printed circuit board C-PCB (Control PCB) on which the timing controller is mounted. For example, the additional printed circuit board may be disposed in the roller 171 or disposed in the housing unit HP at the outside of the roller 171, or disposed to be in direct contact with the printed circuit board 140.

Referring to FIG. 6, the display unit DP according to the present disclosure may include a first cover unit 150 and a second cover unit 160.

In the meantime, the first cover unit 150 according to the exemplary embodiment of the present disclosure imparts a degree of freedom to the routing line area RA without compressing the display panel 120. Further, in order to reduce the interference of the flexible films 130, the first cover unit 150 may be configured with at least two divided chain structures including of a first chain cover plate 150a and a second chain cover plate 150b without having a base plate. However, the present disclosure is not limited thereto and the first cover unit 150 according to the exemplary embodiment of the present disclosure may be configured with at least two divided structures of the first chain cover plate 150a and the second chain cover plate 150b, rather than the chain structure.

The first cover unit 150 is disposed in the second support area PA2 of the back cover 110 to accommodate the plurality of flexible films 130. Further, some of the plurality of flexible films 130, a part of the back cover 110 corresponding to the plurality of flexible films 130, and one end of the display panel 120 coupled to the plurality of flexible films 130 may be covered by the first cover unit 150. The first cover unit 150 is disposed to cover the plurality of flexible films 130 to protect the plurality of flexible films 130. Further, according to the present disclosure, when the second support area PA2 is wound around the roller 171, an empty space may be formed between the first chain cover plate 150a of the first cover unit 150 and the second support area PA2 to reduce the interference of the plurality of flexible films 130. That is, the empty space is formed between the first chain cover plate 150a and the second support area PA2 so that even though the first cover unit 150 is wound around the roller 171 or further wound one more so that the display panel 120 is wound around the roller 171, the first cover unit 150 and the flexible films 130 are not pressed by the display unit DP. Therefore, the flexible film 130 may maintain a flat state and the interference of the flexible films 130 may be reduced. Further, the second chain cover plate 150b of the first cover unit 150 is disposed so as to cover one end of the display panel 120 to fix one end of the display panel 120 so as not to be loosened from the back cover 110. The second chain cover plate 150b is disposed so as to cover one end of the display panel 120 to reduce the separation of the display panel 120 and the back cover 110 due to the repeated winding and unwinding of the display unit DP.

The first chain cover plate 150a and the second chain cover plate 150b may be disposed on one surface of the back cover 110. The first chain cover plate 150a and the second chain cover plate 150b are disposed so as to cover the plurality of flexible films 130 and one end of the display panel 120 disposed on the second support area PA2 of the back cover 110 and may be formed to have a convex shape, respectively. That is, one surfaces of the first chain cover plate 150a and the second chain cover plate 150b may be formed as curved surfaces. The first chain cover plate 150a and the second chain cover plate 150b are formed of a material having a rigidity to protect one end of the display panel 120 and the plurality of flexible films 130, but is not limited thereto.

In the meantime, the first chain cover plate 150a and the second chain cover plate 150b may be coupled to each other. For example, a plurality of fixing holes H1 which passes through the first chain cover plate 150a and the second chain cover plate 150b is formed therein and a member such as a screw is fastened therewith through the plurality of fixing holes H1. By doing this, the first chain cover plate 150a and the second chain cover plate 150b are coupled to each other.

However, the first chain cover plate 150a and the second chain cover plate 150b may be coupled to each other in various manners and are not limited thereto.

Referring to FIG. 6, the second cover unit 160 is disposed in the third support area PA3 of the back cover 110 to accommodate the printed circuit board 140. The printed circuit board 140 and a part of the back cover 110 corresponding to the printed circuit board 140 may be inserted into the second cover unit 160. The second cover unit 160 is disposed to cover the printed circuit board 140 to protect the printed circuit board 140.

The second cover unit 160 may include a base plate 161, a bottom plate 162, and a cover plate 163.

The base plate 161 may be disposed on an opposite surface of one surface of the back cover 110. The base plate 161 may be fixed to the third support area PA3 on the opposite surface of one surface of the back cover 110 on which the display panel 120 is not disposed. The base plate 161 and the printed circuit board 140 may be disposed so as to correspond to each other with the back cover 110 therebetween. Therefore, the base plate 161 may support the printed circuit board 140 together with the third support area PA3. For example, the base plate 161 is formed of a material having a rigidity to support the third support area PA3 to be flat, but is not limited thereto.

A bottom plate 162 may be disposed on one surface of the back cover 110.

The bottom plate 162 may be disposed to support the printed circuit board 140 disposed on the third support area PA3 of the back cover 110. The bottom plate 162 may be disposed between the printed circuit board 140 and the back cover 110. The bottom plate 162 may have a groove in which the printed circuit board 140 is seated so as not to move the printed circuit board 140. That is, in the bottom plate 162, a portion where the printed circuit board 140 is seated may be concave. The groove may be referred to as a seating unit of the bottom plate 162 in which the printed circuit board 140 is seated. Therefore, the floating of the printed circuit board 140 disposed on the bottom plate 162 is reduced and the printed circuit board 140 may be stably disposed. However, the present disclosure is not limited thereto and the bottom plate 162 may be formed to have a flat shape and the cover plate 163 may be disposed on one surface of the back cover 110.

The cover plate 163 may be disposed to cover the printed circuit board 140 disposed on the third support area PA3 of the back cover 110 and may be formed to have a convex shape. That is, one surface of the cover plate 163 may be formed as a curved surface. The cover plate 163 may be fixed to the third support area PA3 and the base plate 161 on one surface of the back cover 110 on which the display panel 120 and the printed circuit board 140 are disposed. The cover plate 163 is formed of a material having a rigidity to protect the printed circuit board 140, but is not limited thereto.

In the meantime, the second cover unit 160 and the back cover 110 may be fixed to each other. For example, a plurality of fixing holes is formed in the third support area PA3 and the protrusion protruding from the base plate 161 is inserted into the fixing hole so that the second cover unit 160 and the back cover 110 may be fixed to each other. For example, the second cover unit 160 and the back cover 110 may be fixed to each other by a member such as a screw which passes through the base plate 161, the bottom plate 162, the cover plate 163, and the back cover 110. In this case, the fastening member such as a screw may be disposed so as not to interfere with the printed circuit board 140 to dispose the printed circuit board 140 at the inside of the second cover unit 160. However, the second cover unit 160 and the back cover 110 may be fixed by various methods, but are not limited thereto.

The first cover unit 150 and the second cover unit 160 may be connected to each other. For example, a plurality of fixing holes H2 which passes through the first cover unit 150 and the second cover unit 160 is formed therein and a member such as a screw is fastened therewith through the plurality of fixing holes H2 so that the first cover unit 150 and the second cover unit 160 are coupled to each other. However, the first cover unit 150 and the second cover unit 160 may be coupled to each other by various methods, but are not limited thereto.

The first cover unit 150 and the second cover unit 160 maintain its original state without being bent when the display unit DP is wound to protect the plurality of flexible films 130 and the printed circuit board 140. Specifically, when the display unit DP is wound, the base plate 161 of the second cover unit 160 having the rigidity maintains a flat state without being bent to protect the printed circuit board 140. A part of the roller 171 around which the base plate 161 is wound may be formed as a flat surface so that the base plate 161 is not bent. For example, the roller 171 may be configured by the flat portion 171F, the first curved portion 171Ra and the second curved portion 171Rb and the base plate 161 is seated on the flat portion 171F. Therefore, even though the display unit DP is wound, the base plate 161 may be maintained to be flat without being bent. Further, as described above, the first cover unit 150 is configured with at least two separated chain structures of the first chain cover plate 150a and the second chain cover plate 150b to protect the flexible film 130 without compressing the display panel 120.

Next, when the display unit DP is wound, the first chain cover plate 150a and the second chain cover plate 150b of the first cover unit 150 and the cover plate 163 of the second cover unit 160 having a rigidity maintain its original convex shape without being deformed to protect the plurality of flexible films 130 and the printed circuit board 140. Further, the first chain cover plate 150a, the second chain cover plate 150b, and the cover plate 163 having a convex shape may form a substantially circular shape together with the first curved portion 171Ra and the second curved portion 171Rb of the roller 171. For example, the first chain cover plate 150a and the second chain cover plate 150b may form a substantial D shape. The base plate 161 having a flat shape and the cover plate 163 having a convex shape may form a substantial D shape. Further, the substantial D-shaped first cover unit 150 is seated on the second curved portion 171Rb of the roller 171 and the D-shaped second cover unit 160 is seated on the flat portion 171F of the roller 171 to form a substantial circular shape together with the first curved portion 171Ra and the second curved portion 171Rb of the roller 171. Accordingly, the first cover unit 150, the second cover unit 160, and the roller 171 form one substantial circular shape and a part of the display panel 120 which is wound on the first cover unit 150 and the second cover unit 160 may be wound with a larger radius of curvature. Therefore, a stress applied to the display panel 120 may be reduced.

Hereinafter, a process of winding the display unit DP around the roller 171 will be described in detail with reference to FIGS. 7A to 7D.

Process of Winding Back Cover and Display Panel

FIGS. 7A to 7D are cross-sectional views in accordance with a driving state of a display device according to an exemplary embodiment of the present disclosure.

Figure 7A:
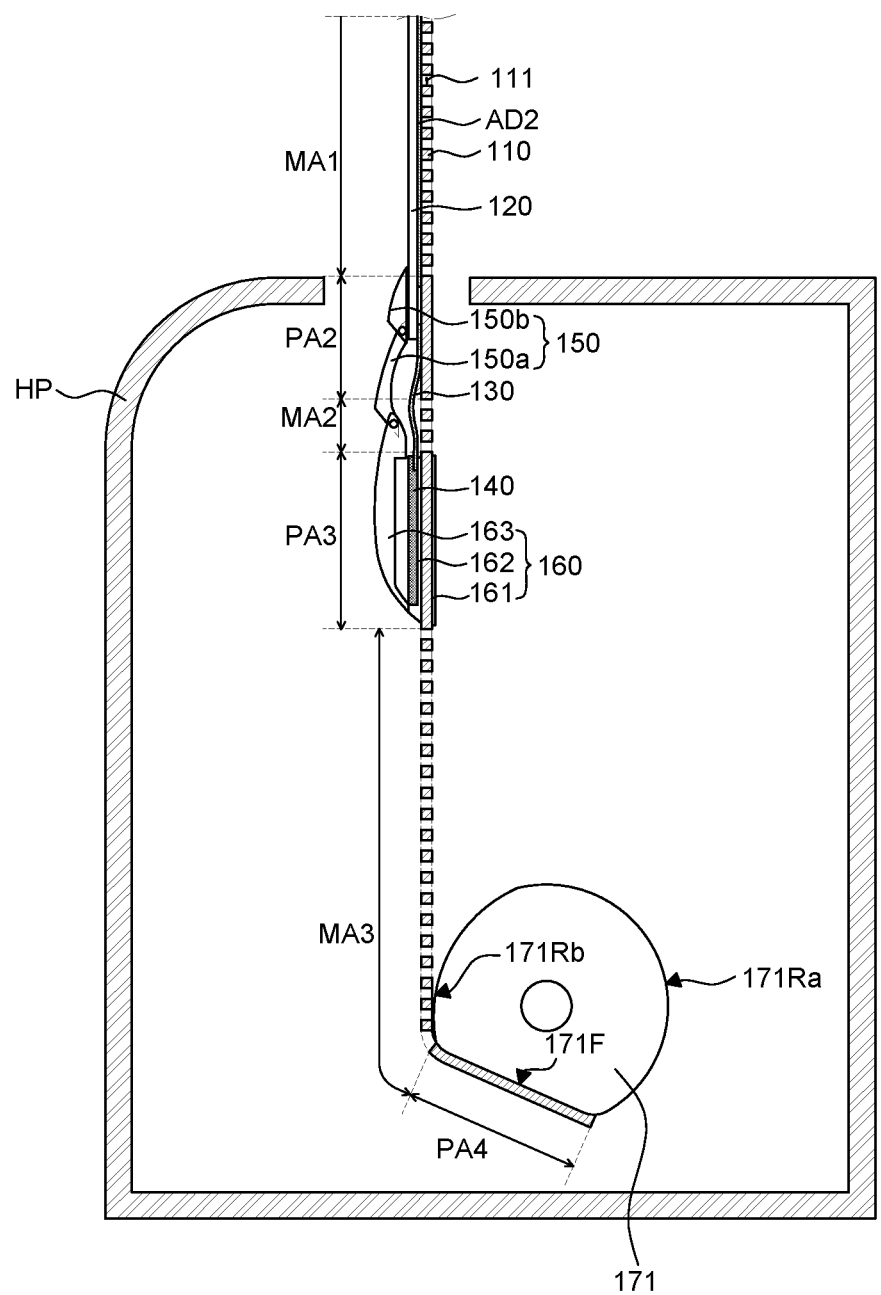
FIGS. 7A to 7D are cross-sectional views in accordance with a driving state of a display device according to an exemplary embodiment of the present disclosure.
Figure 7B:
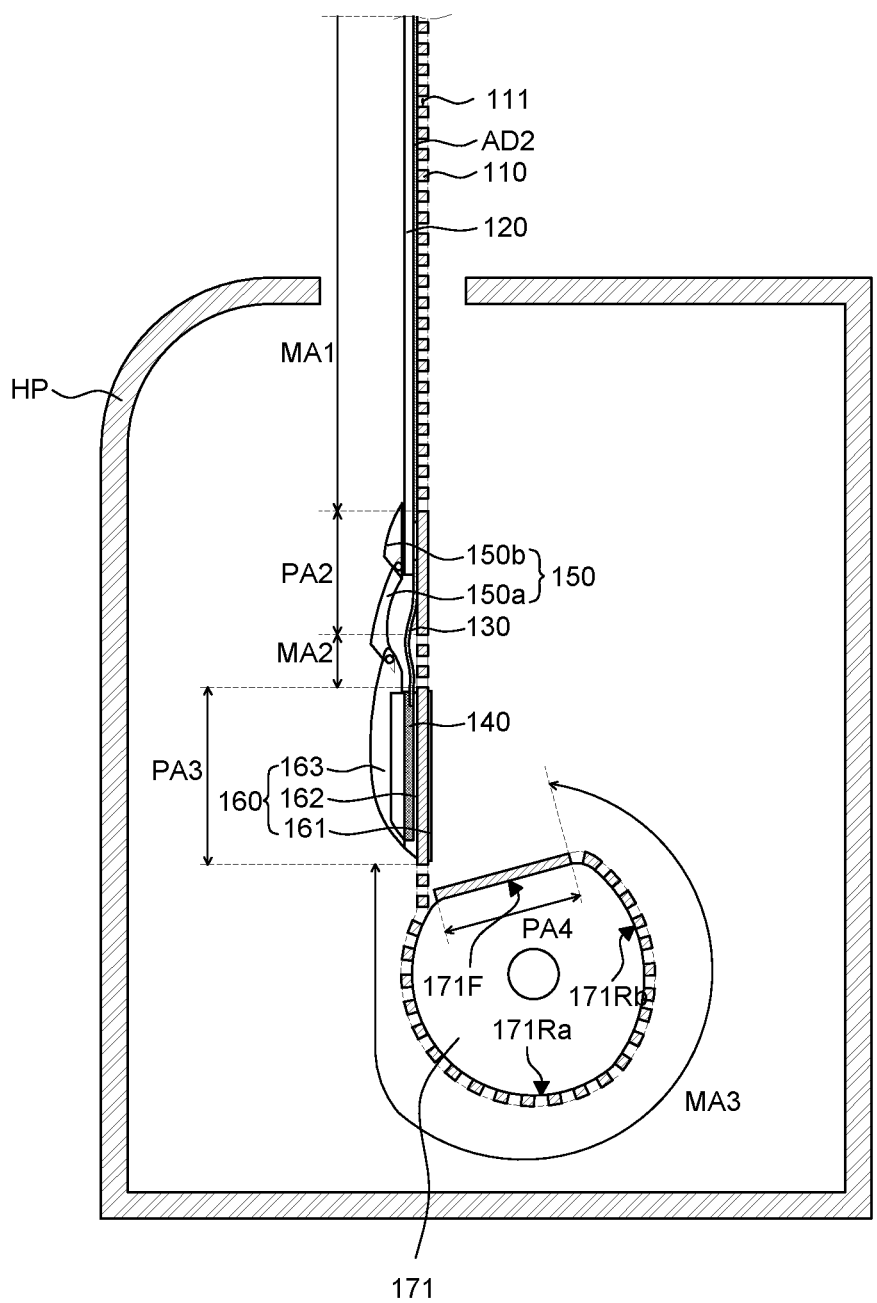
Figure 7C:
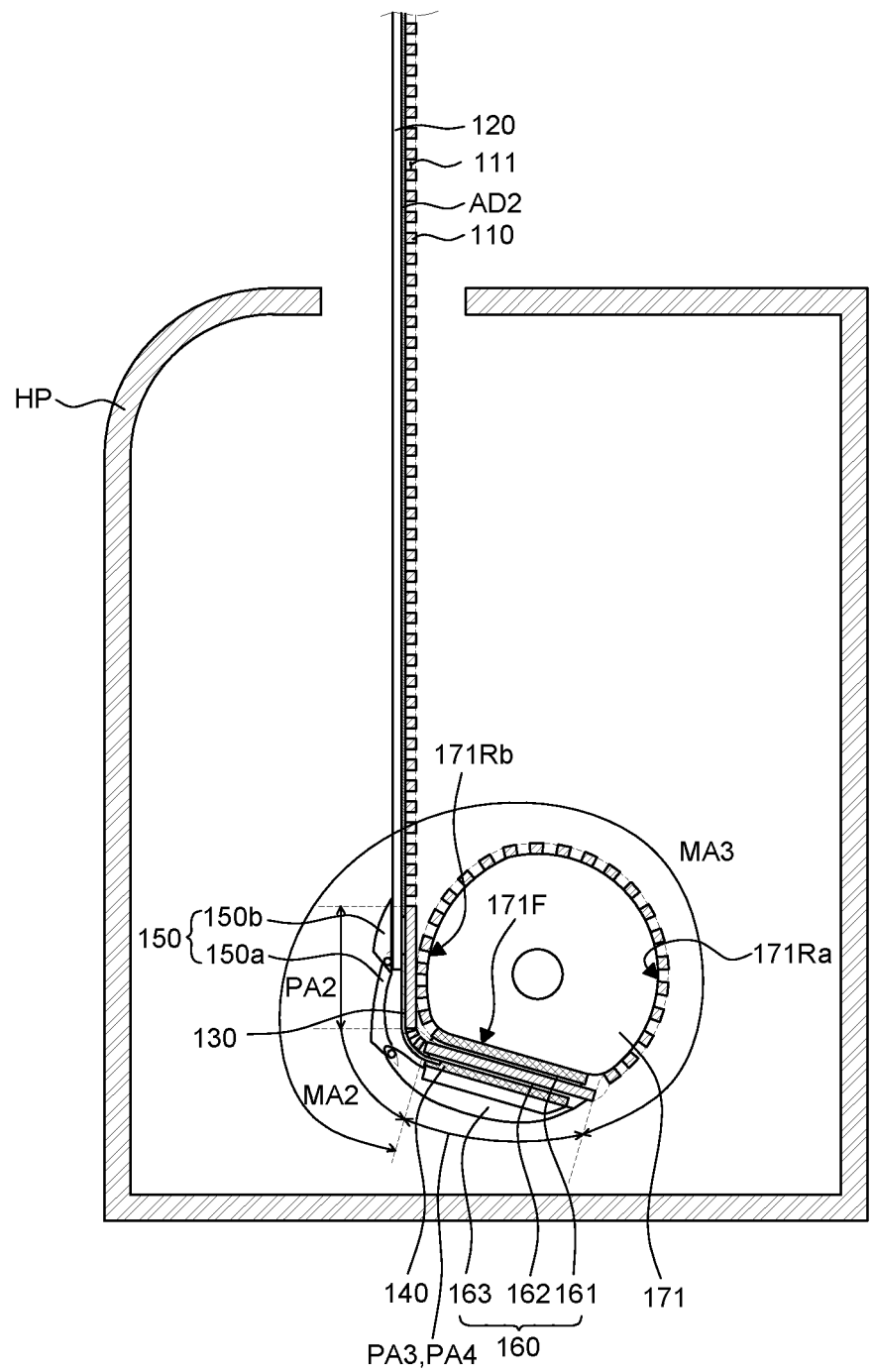
Figure 7D:
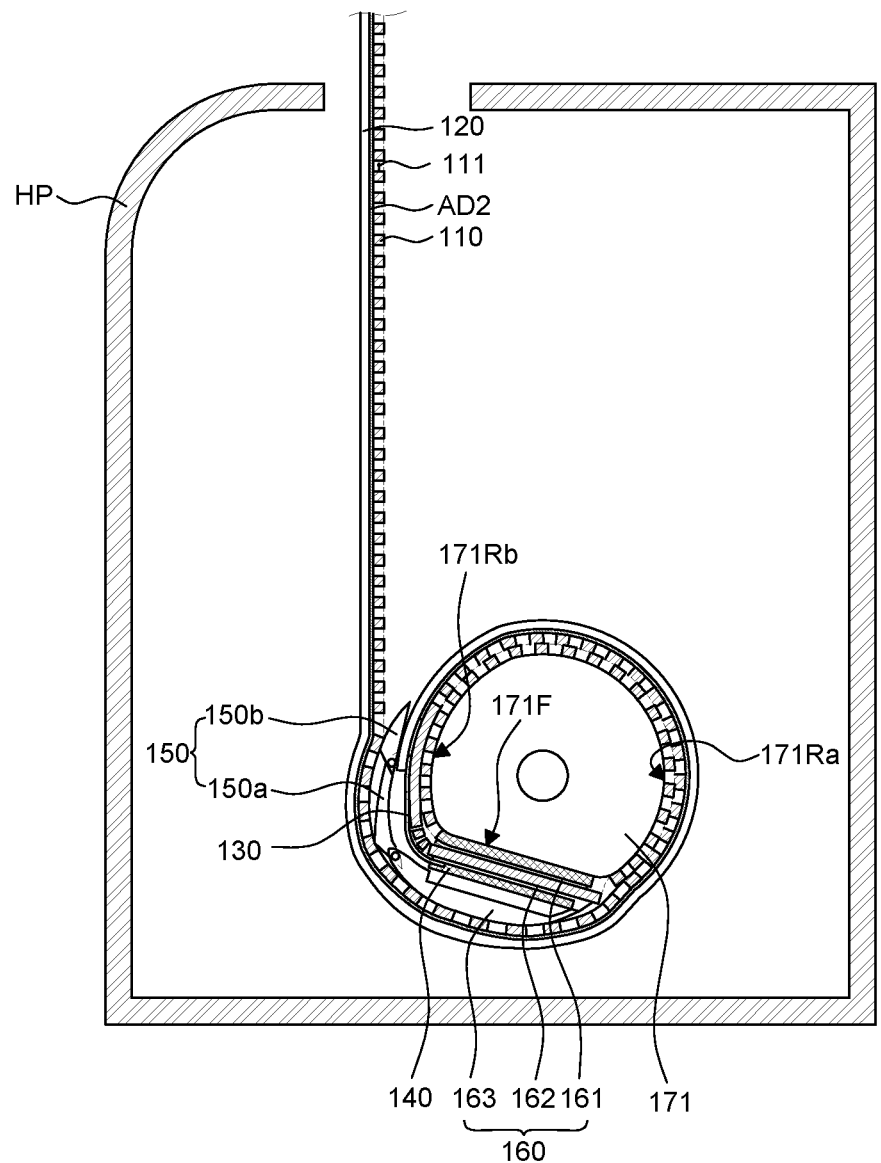

FIG. 7A is a cross-sectional view illustrating a state in which the back cover 110 is fully unwound from the roller 171. FIG. 7B is a cross-sectional view illustrating a state in which the fourth support area PA4 and the third malleable area MA3 of the back cover 110 are wound around the roller 171. FIG. 7C is a cross-sectional view illustrating a state in which the fourth support area PA4, the third malleable area MA3, the third support area PA3, the second malleable area MA2, and the second support area PA2 of the back cover 110 are wound around the roller 171. FIG. 7D is a cross-sectional view illustrating a state in which the fourth support area PA4, the third malleable area MA3, the third support area PA3, the second malleable area MA2, the second support area PA2, and a part of the first malleable area MA1 of the back cover 110 are wound around the roller 171.

Referring to FIG. 7A, the roller 171 is entirely cylindrical, but a part thereof may be flat. A part of the outer circumferential surface of the roller 171 is configured by a flat portion 171F which is formed to be flat and the remaining part of the outer circumferential surface is configured by at least the first curved portion 171Ra and the second curved portion 171Rb formed by curved surfaces.

For example, the flat portion 171F extends from one end of the first curved portion 171Ra and the second curved portion 171Rb may extend from the other end of the first curved portion 171Ra toward the flat portion 171F. In this case, the second curved portion 171Rb is an area where the flexible films 130 are correspondingly disposed and the flat portion 171F is an area where the printed circuit board 140 is correspondingly disposed.

The fourth support area PA4 of the back cover 110 is fastened with one of the flat portion 171F and the second curved portion 171Rb of the roller 171. For example, the fourth support area PA4 may be fastened with the flat portion 171F of the roller 171 and the fourth support area PA4 may be fastened with the second curved portion 171Rb of the roller 171. Except for the fourth support area PA4 fastened with the roller 171, the remaining portion of the back cover 110 extending from the fourth support area PA4 may be flat. Hereinafter, it is assumed that the fourth support area PA4 of the back cover 110 is fastened with the flat portion 171F, but is not limited thereto.

In the meantime, as described above, when the back cover 110 is fully unwound, the fourth support area PA4, the third malleable area MA3, the third support area PA3, the second malleable area MA2, and the second support area PA2 of the back cover 110 may be disposed in the housing unit HP. Further, the first support area PA1 and the first malleable area MA1 may be disposed at the outside of the housing unit HP. Therefore, the display panel 120 is disposed at the outside of the housing unit HP to display the image and the plurality of flexible films 130 and the printed circuit board 140 are disposed at the inside of the housing unit HP so as not to be visibly recognized.

Referring to FIG. 7B, the fourth support area PA4 and the third malleable area MA3 are wound around the roller 171 and the third support area PA3, the second malleable area MA2, the second support area PA2, the first malleable area MA1, and the first support area PA1 extending from the third malleable area MA3 are unwound.

The fourth support area PA4 may be wound on the flat portion 171F of the roller 171. Further, a part of the third malleable area MA3 is wound on the second curved portion 171Rb and the remaining part of the third malleable area MA3 is wound on the first curved portion 171Ra.

Next, referring to FIG. 7C, the fourth support area PA4, the third malleable area MA3, the third support area PA3, the second malleable area MA2, and the second support area PA2 are wound around the roller 171 and the first malleable area MA1 and the first support area PA1 extending from the second support area PA2 are unwound.

The third support area PA3 is wound on the flat portion 171F on which the fourth support area PA4 of the roller 171 is wound and the second support area PA2 is wound on the second curved portion 171Rb on which the third malleable area MA3 is wound. For example, the second malleable area MA2 may be wound at the boundary of the second curved portion 171Rb and the flat portion 171F, but the present disclosure is not limited thereto.

In the meantime, when the second support area PA2 on which the first cover unit 150 is disposed and the third support area PA3 on which the second cover unit 160 is disposed are wound around the roller 171, the first curved portion 171Ra of the roller 171, the first cover unit 150, and the second cover unit 160 may form a substantial circular shape. Specifically, the first chain cover plate 150a and the second chain cover plate 150b of the first cover unit 150 have a convex shape and the cover plate 163 of the second cover unit 160 also has a convex shape. Therefore, the first chain cover plate 150a and the second chain cover plate 150b, and the cover plate 163 and the first curved portion 171Ra may form a substantially circular shape.

When the second support area PA2 on which the plurality of flexible films 130 and the first cover unit 150 are disposed is wound on the second curved portion 171Rb of the roller 171, an empty space is formed between the first cover unit 150 and the second support area PA2. Therefore, at least a part of the plurality of flexible films 130 and the second support area PA2, and the first cover unit 150 may be maintained to be flat.

The third support area PA3 on which the printed circuit board 140 and the second cover unit 160 are disposed is wound on the flat portion 171F of the roller 171 so that the third support area PA3, the second cover unit 160, and the printed circuit board 140 may be maintained to be flat.

Therefore, at least a part of the plurality of flexible films 130, the printed circuit board 140, the first cover unit 150, and the second cover unit 160 maintain a flat state regardless of the winding or unwinding of the display unit DP and the damage caused when the plurality of flexible films 130 and the printed circuit board 140 are bent may be reduced.

In the meantime, in order to wind the second support area PA2 and the third support area PA3 on the second curved portion 171Rb and the flat portion 171F, respectively, the back cover 110 may be configured to be bent at the boundary between the second support area PA2 and the third support area PA3. The second malleable area MA2 having a plurality of openings 111 is disposed between the second support area PA2 and the third support area PA3 and the second malleable area MA2 may be wound on the boundary between the second curved portion 171Rb and the flat portion 171F.

The second malleable area MA2 of the back cover 110 and a part of the plurality of flexible films 130 may be wound at the boundary between the second curved portion 171Rb and the flat portion 171F. In this case, the radius of curvature at the boundary between the second curved portion 171Rb and the flat portion 171F is small so that a stress applied to a part of the display unit DP which is wound on the boundary between the second curved portion 171Rb and the flat portion 171F may be large. However, the second malleable area MA2 of the back cover 110 is formed of a material having large rigidity and includes the plurality of openings 111 so that the flexibility is high. Therefore, the damage due to the radius of curvature at the boundary of the second curved portion 171Rb and the flat portion 171F may be reduced.

Further, the plurality of flexible films 130 is formed to be longer than the length of the second support area PA2 so as not to be in close contact with the back cover 110 so that the damage at the boundary of the second curved portion 171Rb and the flat portion 171F due to the radius of curvature may be reduced. Specifically, the length of the plurality of flexible films 130 may be larger than the length of the second support area PA2. The length of the plurality of flexible films 130 may be larger than a distance between an edge of the first malleable area MA1 on which one end of the display panel 120 is disposed and an edge of the third support area PA3 on which one end of the printed circuit board 140 is disposed. As a result, as illustrated in FIG. 7A, in the fully unwound state of the display unit DP, the plurality of flexible films 130 may not be pressed by the first cover unit 150. As illustrated in FIG. 7C, even though the display unit DP is wound around the roller 171, the plurality of flexible films 130 is not pressed by the wound display unit DP so that the flexible films 130 maintain a flat state and the interference of the flexible film 130 may be reduced.

Referring to FIG. 7D, the fourth support area PA4, the third malleable area MA3, the third support area PA3, the second malleable area MA2, the second support area PA2, and a part of the first malleable area MA1 are wound around the roller 171 and the remaining part of the first malleable area MA1 and the first support area PA1 are unwound.

The first malleable area MA1 is wound on the flat portion 171F of the roller 171 on which the fourth support area PA4 and the third support area PA3 are wound, and the malleable area MA is wound on the second curved portion 171Rb on which the third malleable area MA3 and the second support area PA2 are wound. Further, the first malleable area MA1 is wound on the first curved portion 171Ra on which the third malleable area MA3 is wound.

In the meantime, the first malleable area MA1 may be wound with a substantially circular shape. Specifically, when the first cover unit 150 of the second support area PA2 and the second cover unit 160 of the third support area PA3 are wound on the second curved portion 171Rb and the flat portion 171F of the roller 171, the first cover unit 150 and the second cover unit 160 formed as a substantial D shape may form one circular shape together with the first curved portion 171Ra. Therefore, the first malleable area MA1 wound on the first cover unit 150, the second cover unit 160, and the first curved portion 171Ra and the display panel 120 on the first malleable area MA1 may be wound with a substantially circular shape.

As described above, the roller 171 may be formed to have a cylindrical shape in which a part of an outer circumferential surface of the roller 171 is flat and the remaining part of the outer circumferential surface is a curved surface. That is, even though the roller 171 may be entirely a cylindrical shape, but a part thereof may be formed of a flat surface. Further, the remaining part of the outer circumferential surface of the roller 171 may be configured by at least two curved surfaces. That is, a part of the outer circumferential surface of the roller 171 is formed to be flat and the remaining part of the outer circumferential surface is configured by at least two curved surfaces having different radii of curvature. For example, the roller 171 is configured by a flat portion 171F, a first curved portion 171Ra, and a second curved portion 171Rb. The radius of curvature of the first curved portion 171Ra may be larger than the radius of curvature of the second curved portion 171Rb. For example, the first curved portion 171Ra is an outer line of the outer circumferential surface of the roller 171 with a radius of curvature of approximately 40 R. In contrast, the second curved portion 171Rb is an inner line of the outer circumferential surface of the roller 171 and has a radius of curvature which is smaller than the radius of curvature of the first curved portion 171Ra. As described above, the second curved portion 171Rb has a radius of curvature which is smaller than the radius of curvature of the first curved portion 171Ra and the inner line of the second curved portion 171Rb is inside more than the outer line of the first curved portion 171Ra. Therefore, an empty space for ensuring a degree of freedom of the flexible films 130 may be formed between the first cover unit 150 and the second curved portion 171Rb.

Further, a radius of curvature at the boundary of the second curved portion 171Rb and the flat portion 171F may be smaller than the radius of curvature of the first curved portion 171Ra. Further, a radius of curvature at the boundary of the second curved portion 171Rb and the first curved portion 171Ra and a radius of curvature at the boundary of the flat portion 171F and the first curved portion 171Ra may also be smaller than the radius of curvature of the first curved portion 171Ra. The radius of curvature indicates a degree of bending so that when the radius of curvature is large, it is close to the flat surface. A part of the display unit DP which is wound on the boundary of the second curved portion 171Rb and the flat portion 171F, the boundary of the second curved portion 171Rb and the first curved portion 171Ra, and the boundary of the flat portion 171F and the first curved portion 171Ra is bent more than the remaining of the display unit DP which is wound on the second curved portion 171Rb, the flat portion 171F, and the first curved portion 171Ra so that more stress may be applied thereto. In the meantime, when the display unit DP is fully wound, the first malleable area MA1 of the back cover 110 and the display panel 120 may be wound on second curved portion 171Rb, the flat portion 171F, and the first curved portion 171Ra. Since the back cover 110 is formed of a material having a rigidity, even though a stress is applied, the back cover 110 may not be easily cracked. In contrast, the display panel 120 may be easily cracked due to the stress increased due to the small radius of curvature. Therefore, in the display device 100 according to the exemplary embodiment of the present disclosure, when the display unit DP is wound with an increased radius of curvature with which the display panel 120 is wound, stress applied to the display panel 120 may be relieved. For example, the back cover is wound around the roller 171 from the fourth support area PA4 below the back cover 110 so that the fourth support area PA4, the third malleable area MA3, the third support area PA3, the second malleable area MA2, and the second support area PA2 of the back cover 110 are wound around the roller 171. Thereafter, the first malleable area MA1 of the back cover 110 and the display panel 120 may be wound on the fourth support area PA4, the third malleable area MA3, the third support area PA3, the second malleable area MA2, and the second support area PA2. That is, after the first cover unit 150 and the second cover unit 160 in which the second support area PA2 and the third support area PA3 of the back cover 110 are accommodated, respectively, are wound around the roller 171, the first malleable area MA1 of the back cover 110 and the display panel 120 may be wound on the first cover unit 150 and the second cover unit 160. The first chain cover plate 150a and the second chain cover plate 150b of the first cover unit 150 and the cover plate 163 of the second cover unit 160 may have one surface formed as a curved surface. Therefore, when the first cover unit 150 and the second cover unit 160 are wound around the roller 171, the first chain cover plate 150a, the second chain cover plate 150b, the cover plate 163, and the first curved portion 171Ra may form a substantially circular shape. Therefore, the display panel 120 is wound on the first cover unit 150, the second cover unit 160, and the first curved portion 171Ra so that when the display unit DP is wound, the stress applied to the display panel 120 may be more alleviated. That is, the display panel 120 is not bent at the boundary of the second curved portion 171Rb and the flat portion 171F, the boundary of the second curved portion 171Rb and the first curved portion 171Ra, and the boundary of the flat portion 171F and the first curved portion 171Ra with a relatively smaller radius of curvature. However, the display panel 120 is bent on the first cover unit 150, the second cover unit 160, and the first curved portion 171Ra with a relatively large radius of curvature so that the stress applied to the display panel 120 may also be reduced.

In the display device 100 according to the exemplary embodiment of the present disclosure, the plurality of flexible films 130 and the printed circuit board 140 are disposed in the second support area PA2 and the third support area PA3 of the back cover 110 and the first cover unit 150 and the second cover unit 160 which accommodate the plurality of flexible films 130 and the printed circuit board 140 are disposed. Therefore, the damage of the plurality of flexible films 130 and the printed circuit board 140 may be reduced. Specifically, when the display unit DP is wound around the roller 171, the back cover 110 is wound while being bent in accordance with the shape of the roller 171. However, when the plurality of flexible films 130 and the printed circuit board 140 are bent in accordance with the shape of the roller 171, the stress may be applied to the plurality of flexible films 130 and the printed circuit board 140. Specifically, the printed circuit board 140 formed of a hard material may be broken. In this case, the second support area PA2 and the third support area PA3 do not have the plurality of openings 111 and are always maintained to be flat to support the plurality of flexible films 130 and the printed circuit board 140 disposed on the second support area PA2 and the third support area PA3 to be maintained to be flat. Here, the first cover unit 150 and the second cover unit 160 formed of a material having a rigidity are disposed to protect the plurality of flexible films 130 and the printed circuit board 140. Further, the empty space is formed between the first chain cover plate 150a of the first cover unit 150 and the second support area PA2 and a part of the roller 171 on which the third support area PA3 is wound is formed by the flat portion 171F. Therefore, the second support area PA2 and the third support area PA3 may be flatly wound on the roller 171. Accordingly, even though the second support area PA2 and the third support area PA3 are wound around the roller 171, a flat state may be maintained and the plurality of flexible films 130 and the printed circuit board 140 attached to the second support area PA2 may also be maintained to be flat. For example, when the display unit DP is fully wound, the plurality of flexible films 130 is accommodated in the empty space between the first chain cover plate 150a of the first cover unit 150 and the second support area PA2 and the printed circuit board 140 is seated in the flat portion 171F of the roller 171 to be maintained to be flat. Further, the first cover unit 150 and the second cover unit 160 are disposed to cover the plurality of flexible films 130 and the printed circuit board 140 so that even though other configuration of the display unit DP is wound on the plurality of flexible films 130 and the printed circuit board 140, it does not interfere with the plurality of flexible films 130 and the printed circuit board 140. Therefore, in the display device 100 according to the exemplary embodiment of the present disclosure, the plurality of flexible films 130 and the first cover unit 150 are disposed in the second support area PA2 and the printed circuit board 140 and the second cover unit 160 are disposed in the third support area PA3. Therefore, the plurality of flexible films 130 and the printed circuit board 140 are maintained to be flat and protected from the external impact. Further, in the display device 100 according to the exemplary embodiment of the present disclosure, the flat portion 171F is formed on a part of the outer circumferential surface of the roller 171 so that the printed circuit board is not bent. Furthermore, the empty space is formed between the first chain cover plate 150a of the first cover unit 150 and the second support area PA2 so that the plurality of flexible films 130 is not pressed. Therefore, the damage of the plurality of flexible films 130 and the printed circuit board 140 may be reduced.

In the display device 100 according to the exemplary embodiment of the present disclosure, one end of the display panel 120 is disposed at the inside of the first cover unit 150 so that the separation of one end of the display panel 120 from the back cover 110 may be reduced. When the display unit DP is repeatedly wound and unwound, the display panel 120 and the back cover 110 may be repeatedly bent. When the display panel 120 and the back cover 110 are repeatedly bent, the adhesiveness of the second adhesive layer AD2 which bonds the display panel 120 with the back cover 110 may be weakened and the display panel 120 and the back cover 110 may be separated. Specifically, the separation is generated at the edge of the display panel 120 to be spread to the entire display panel 120. Therefore, one end of the display panel 120 is disposed in the first cover unit 150 in which the plurality of flexible films 130 is accommodated so that the separation of the end of the display panel 120 from the back cover 110 may be suppressed. The first cover unit 150 is disposed so as to cover one end of the display panel 120 so that the loosening of one end of the display panel 120 from the back cover 110 may be reduced. Therefore, in the display device 100 according to the exemplary embodiment of the present disclosure, the first cover unit 150 which covers one end of the display panel 120 is disposed to reduce the loosening of the edge of the display panel and also reduced the separation between the display panel 120 and the back cover 110.

Hereinafter, a shape of the roller 171 according to the present disclosure will be described in more detail with reference to FIGS. 8A, 8B, and 9.

Shape of Roller

Figure 8A:
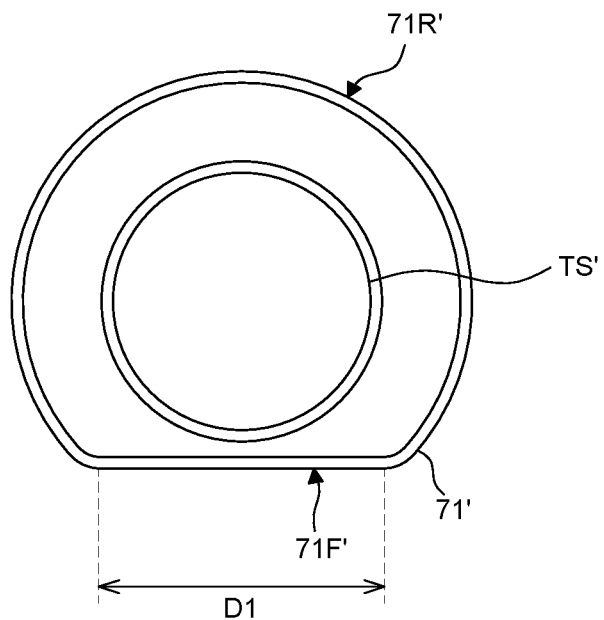
FIGS. 8A and 8B are schematic cross-sectional views of a roller according to a comparative embodiment.
Figure 8B:
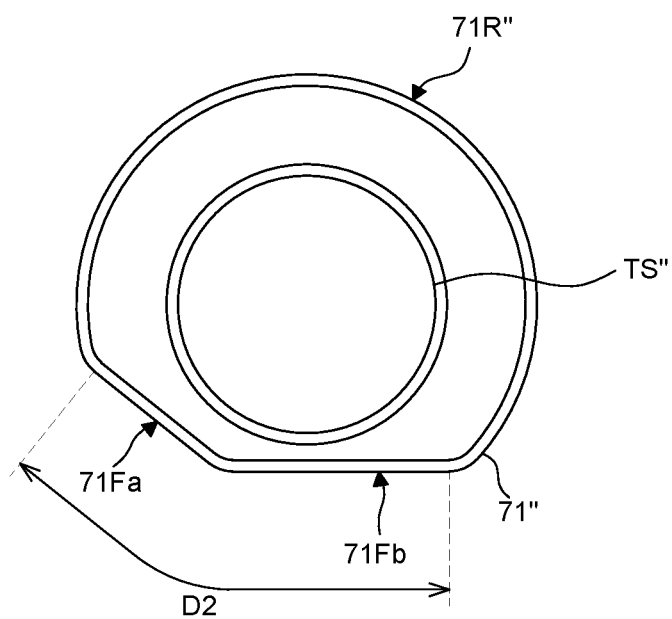

FIGS. 8A and 8B are schematic cross-sectional views of a display device according to a comparative embodiment.

Figure 9:
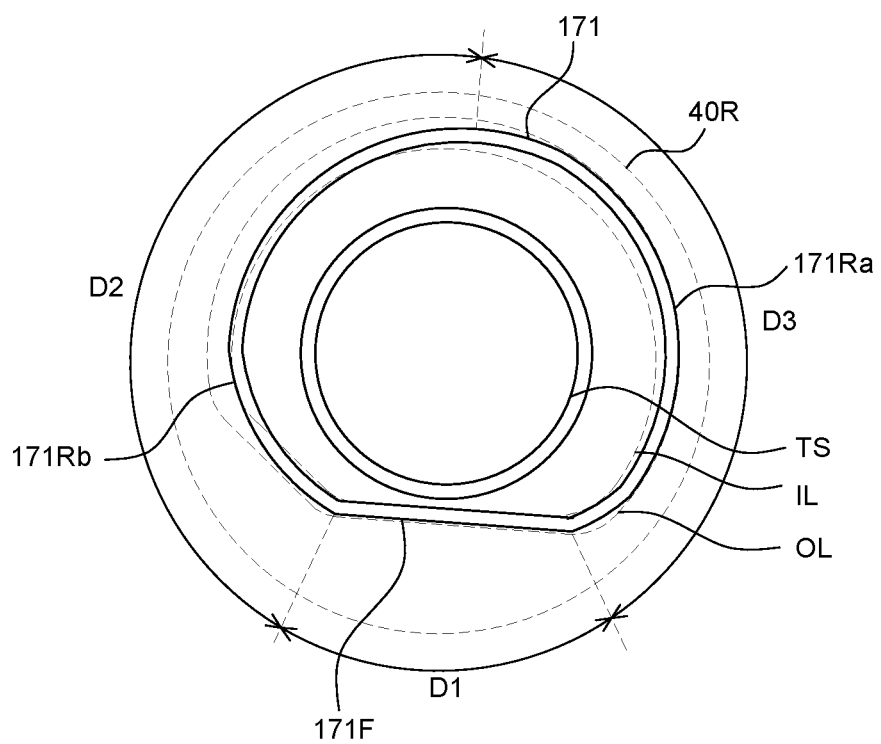
FIG. 9 is a schematic cross-sectional view of a roller according to an exemplary embodiment of the present disclosure.

FIG. 9 is a schematic cross-sectional view of a roller according to an exemplary embodiment of the present disclosure.

FIG. 8A is a cross-sectional view of a roller 71' of a display device according to a comparative embodiment. FIG. 8B is a cross-sectional view of a roller 71" of a display device according to another comparative embodiment. The roller 71' of the display device according to a comparative embodiment of FIG. 8A has a structure in which only one flat portion 71F' is disposed in the roller 71'. The roller 71" of the display device according to another comparative embodiment of FIG. 8B has a structure in which two flat portions 71Fa and 71Fb are disposed in the roller 71".

The roller 171 of the display device according to the exemplary embodiment of FIG. 9 has the same structure as the roller 171 of the display device 100 according to the exemplary embodiment of the present disclosure.

Referring to FIGS. 8A and 8B, torsion springs TS' and TS" may be further disposed in the rollers 71' and 71" to rotate the rollers 71' and 71". The torsion springs TS' and TS" are disposed in the roller 71' and 71" to supply additional force to the rollers 71' and 71" when the display unit DP is wound. Further, in the rollers 71' and 71", a predetermined space is necessary to dispose the torsion springs TS' and TS".

Referring to FIG. 8A, the roller 71' according to the comparative embodiment is configured by one flat portion 71F' and one curved portion 71R'. When the display unit is wound, the plurality of flexible films and the printed circuit board may be seated in the flat portion 71F'. In this case, the flat portion 71F' may be formed so as not to interfere with the torsion spring TS' in the roller 71'.

When one flat portion 71F' is formed so as not to interfere with the torsion spring TS', a maximum length of the flat portion 71F' may be a first length D1. Further, a length from one end of the plurality of flexible films to the other end of the printed circuit board may be equal to or smaller than the first length D1. Specifically, when the display unit is wound, the plurality of flexible films and the printed circuit board need to be seated in the flat portion 71F' so as to reduce the damage of the plurality of flexible films and the printed circuit board. Accordingly, the plurality of flexible films and the printed circuit board need to be designed such that a sum of the length of the plurality of flexible films and the length of the printed circuit board does not exceed the first length D1.

Referring to FIG. 8B, the roller 71" according to another comparative embodiment is configured by a first flat portion 71Fa, a second flat portion 71Fb, and a curved portion 71R". When the display unit is wound, the plurality of flexible films may be seated in the first flat portion 71Fa and the printed circuit board may be seated in the second flat portion 71Fb. Further, the first flat portion 71Fa and the second flat portion 71Fb may be formed so as not to interfere with the torsion spring TS" in the roller 71".

Further, when the first flat portion 71Fa and the second flat portion 71Fb are formed so as not to interfere with the torsion spring TS", the entire length of the first flat portion 71Fa and the second flat portion 71Fb may be a second length D2 which is larger than the first length D1. A length from one end of the plurality of flexible films to the other end of the printed circuit board may be equal to or smaller than the second length D2. The length of the plurality of flexible films may be designed to be equal to or smaller than the length of the first flat portion 71Fa and the length of the printed circuit board may be designed to be equal to or smaller than the length of the second flat portion 71Fb.

In the roller 71' according to the comparative embodiment of FIG. 8A, only one flat portion 71F' is formed and in the roller 71" according to another comparative embodiment of FIG. 8B, two flat portions, for example, the first flat portion 71Fa and the second flat portion 71Fb are formed. In this case, in the rollers 71' and 71" of FIGS. 8A and 8B, the flat portion 71F', the first flat portion 71Fa, and the second flat portion 71Fb may be formed so as not to interfere with the torsion spring TS' and TS". In order to avoid the interference with the torsion spring TS' in the roller 71' according to the comparative embodiment, it may be difficult to extend the length of the flat portion 71F' to a predetermined level or more. In contrast, in the roller 71" according to another comparative embodiment, two flat portions, that is, the first flat portion 71Fa and the second flat portion 71Fb are formed so that as compared with the comparative embodiment, the entire area of the flat portions 71Fa and 71Fb may be increased. Accordingly, as compared with the roller 71' according to the comparative embodiment, in the roller 71" according to another comparative embodiment, the area in which the plurality of flexible films and the printed circuit board may be disposed may be improved.

Further, in the roller 71' according to the comparative embodiment, in order to ensure the area of the flat portion 71F' in which the plurality of flexible films and the printed circuit board of the related art are disposed, the plurality of flexible films and the printed circuit board may be designed to reduce the sizes of the plurality of flexible films and the printed circuit board. Further, the area of the flat portion 71F' may be improved by increasing a diameter of the roller 71'.

In contrast, in the roller 71" according to another comparative embodiment, the first flat portion 71Fa and the second flat portion 71Fb are formed to easily ensure the area for disposing the plurality of flexible films and the printed circuit board. Therefore, in the roller 71" according to another comparative embodiment, the plurality of flexible films and the printed circuit board may be disposed without being designed to reduce the sizes of the plurality of flexible films and the printed circuit board and increasing a diameter of the roller 71".

In the meantime, also in another comparative embodiment, in the routing line area which is a section with a radius of curvature of 14 R, when the display panel is wound or unwound, the crack is generated. This is because when the display panel is wound or unwound, a normal reaction force of the routing line area is transmitted to the display panel and a force to recover the display panel which has received a spring back effect to a connection direction of the roller 71" is strongly applied. The spring back phenomenon refers to a phenomenon in which when a plate or an iron wire is bent and then released, the plate or iron wire is returned to its original position while deformation remains.

Therefore, according to the present disclosure, the outer circumferential surface of the roller 171 is partially designed by the outer line OL of the first curved portion 171Ra and the inner line IL of the second curved portion 171Rb so that the routing line area is floated from the roller 171 to maintain a tangential direction. Therefore, even though the spring back is caused by the normal reaction force, the first cover unit 150 may not compress the display panel 120.

Further, as compared with another comparative embodiment, according to the exemplary embodiment of the present disclosure, the configuration of the second cover unit 160 is maintained and the first cover unit 150 is configured with at least two divided chain structures including the first chain cover plate 150a and the second chain cover plate 150b without having a base plate of the related art. Therefore, the degree of freedom of the routing line area is increased and the interference of the plurality of flexible films 130 between the first cover unit 150 and the base plate of the related art may be reduced.

Further, referring to FIG. 9, a torsion spring TS may be further disposed in the roller 171 to rotate the roller 171. The torsion spring TS is disposed in the roller 171 to supply additional force to the roller 171 when the display unit DP is wound. Further, in the roller 171, a predetermined space is necessary to dispose the torsion spring TS.

Referring to FIG. 9, the roller 171 according to the exemplary embodiment of the present disclosure is configured by a flat portion 171F, a first curved portion 171Ra, and a second curved portion 171Rb. In this case, when the display unit DP is wound, the plurality of flexible films 130 may be seated in the second curved portion 171Rb and the printed circuit board 140 may be seated in the flat portion 171F. Further, the flat portion 171F may be formed so as not to interfere with the torsion spring TS in the roller 171.

When one flat portion 171F is formed so as not to interfere with the torsion spring TS, a maximum length of the flat portion 171F may be a first length D1.

The first curved portion 171Ra has the same radius of curvature as the outer line OL of the roller 171 and in contrast, the second curved portion 171Rb has the same radius of curvature as the inner line IL of the roller 171.

The outer line OL of the roller 171 may have a radius of curvature of approximately 40 R.

The second curved portion 171Rb may have a second length D2 and the first curved portion 171Ra may have a third length D3.

In the meantime, the back covers of the present disclosure may be divided into two or more back covers, which will be described in more detail with reference to another exemplary embodiment of the present disclosure.

Coupling of Back Cover

Figure 10:
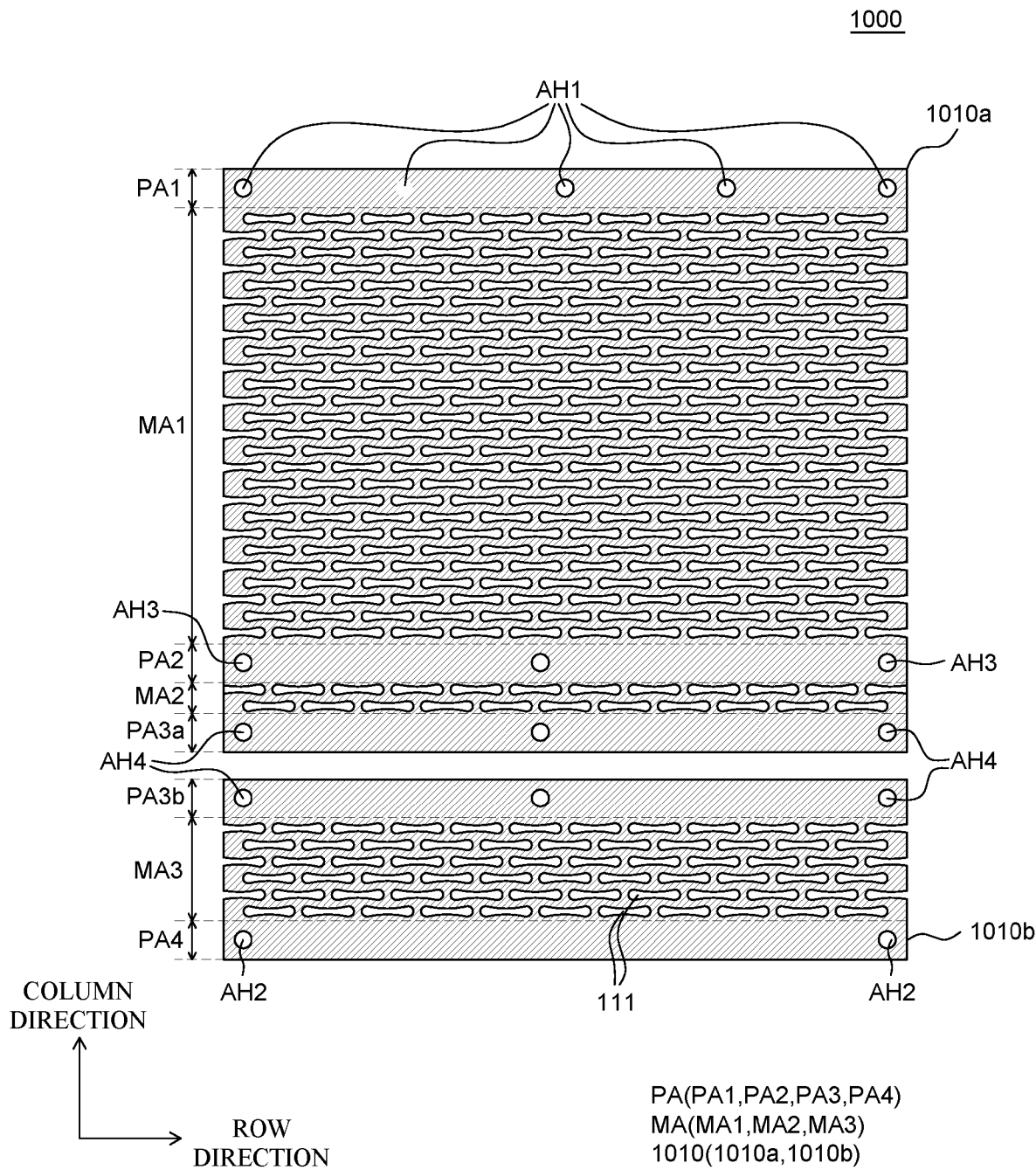
FIG. 10 is a plan view illustrating a back cover of a display device according to another exemplary embodiment of the present disclosure.

FIG. 10 is a plan view illustrating a back cover of a display device according to another exemplary embodiment of the present disclosure.

Figure 11:
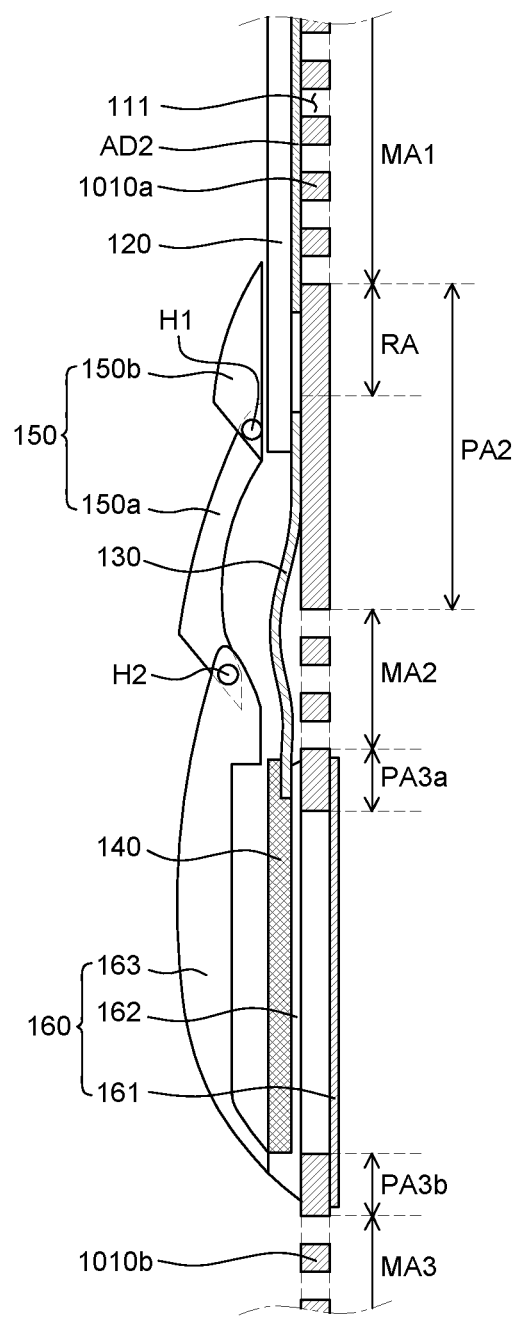
FIG. 11 is a cross-sectional view of a display device according to another exemplary embodiment of the present disclosure.

FIG. 11 is a cross-sectional view of a display device according to another exemplary embodiment of the present disclosure.

Figure 12A:
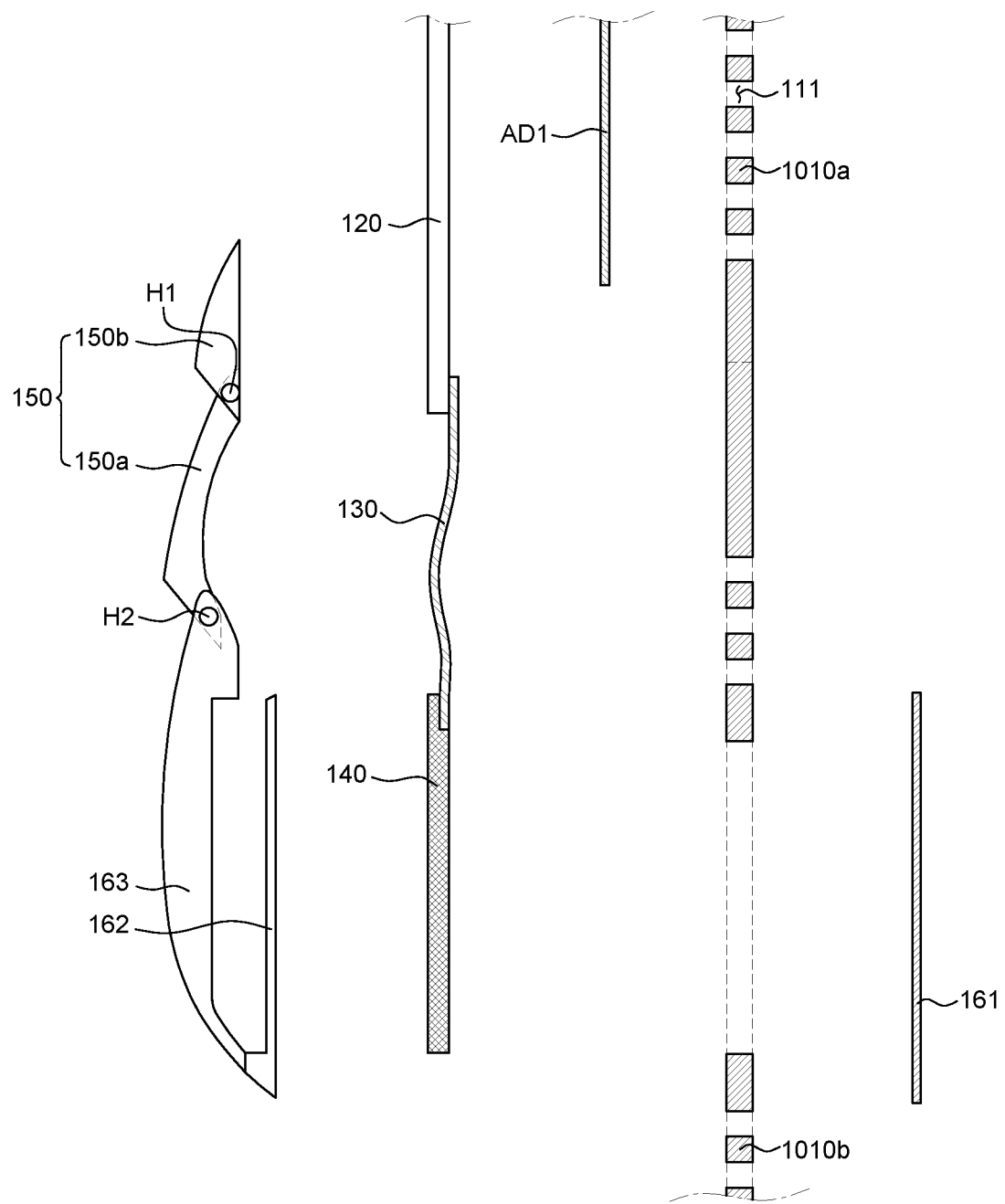
FIGS. 12A to 12C are cross-sectional views of a fastening process of a display device according to another exemplary embodiment of the present disclosure.
Figure 12B:
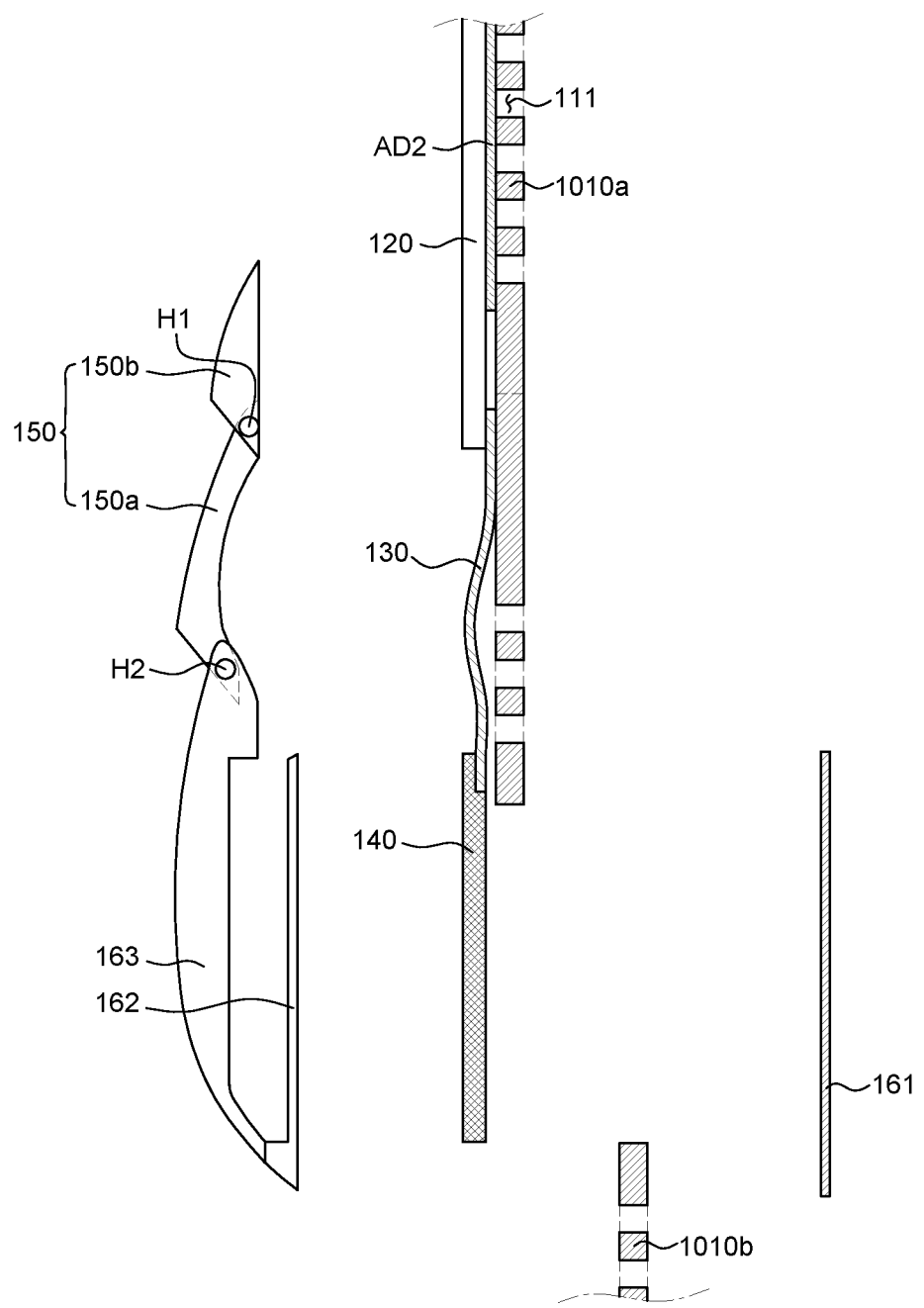
Figure 12C:
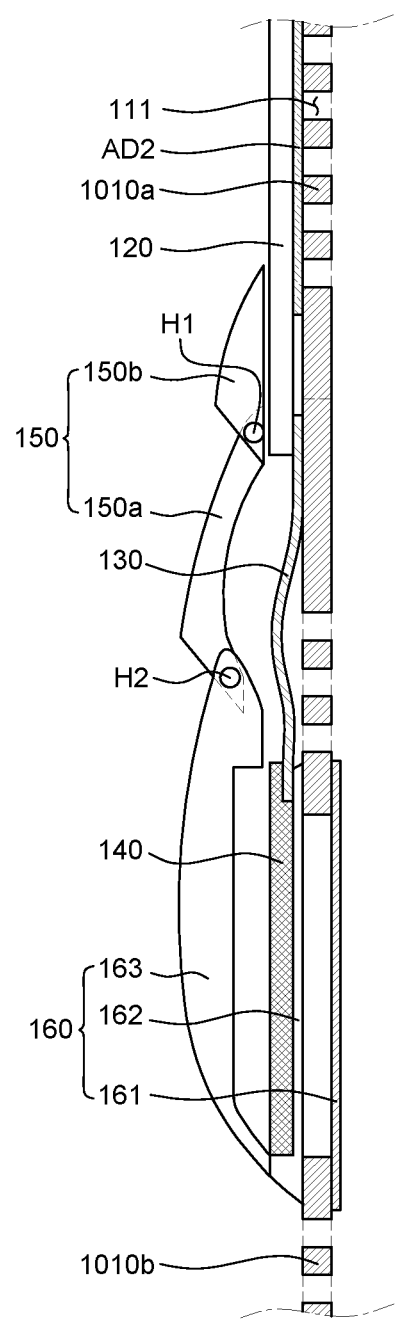

FIGS. 12A to 12C are cross-sectional views of a fastening process of a display device according to another exemplary embodiment of the present disclosure.

FIG. 12A illustrates a state before fastening a back cover 1010, a display panel 120, a first cover unit 150, and a second cover unit 160 of the present disclosure with each other. Further, FIG. 12B illustrates a state in which the back cover 1010 and the display panel 120 are fastened with each other. FIG. 12C illustrates a state after fastening the back cover 1010, the display panel 120, the first cover unit 150, and the second cover unit 160 of the present disclosure with each other.

The only difference between a display device 1000 illustrated in FIGS. 10, 11, and 12A to 12C and the display device 100 of FIGS. 1 to 7D is a back cover 1010, but other configuration is substantially the same, so that a redundant description will be omitted. In FIG. 10, for the convenience of description, among various configurations of the display device 1000, only the back cover 1010 is illustrated.

Referring to FIG. 10, the back cover 1010 according to another exemplary embodiment of the present disclosure may include a first back cover 1010a and a second back cover 1010b. That is, the back cover 1010 according to another exemplary embodiment of the present disclosure may be configured to be divided into the first back cover 1010a and the second back cover 1010b. For example, the back cover 1010 may be configured to be divided into the first back cover 1010a and the second back cover 1010b with respect to the above-described third support area PA3 according to the exemplary embodiment of the present disclosure.

In this case, the first back cover 1010a may be fastened with the head bar 182 and the second back cover 1010b may be fastened with the roller 171.

The first back cover 1010a includes a first support area PA1, a first malleable area MA1, a second support area PA2, a second malleable area MA2, and a first fixing area PA3a. A fourth fastening hole AH4 is formed in the first fixing area PA3a, but the present disclosure is not limited thereto.

The second back cover 1010b includes a second fixing area PA3b, a third malleable area MA3, and a fourth support area PA4. A fourth fastening hole AH4 is formed in the second fixing area PA3b.

The first fixing area PA3a is an area corresponding to an upper portion of the third support area PA3 according to the exemplary embodiment of the present disclosure and is fastened with the base plate 161 and a bottom plate 162. For example, the upper portions of the base plate 161 and the bottom plate 162 may be fastened with the first fixing area PA3a.

The second fixing area PA3b is an area corresponding to a lower portion of the third support area PA3 according to the exemplary embodiment of the present disclosure and is fastened with the base plate 161 and a bottom plate 162. For example, the lower portions of the base plate 161 and the bottom plate 162 may be fastened with the second fixing area PA3b.

The first fixing area PA3a and the second fixing area PA3b may be connected by the second cover unit 160. For example, the first fixing area PA3a of the first back cover 1010a and the second fixing area PA3b of the second back cover 1010b may be coupled by a plurality of fixing protrusions of the base plate 161. The fixing protrusion disposed above the base plate 161 is inserted into a fourth fastening hole AH4 of the first fixing area PA3a and the fixing protrusion disposed below the base plate 161 is inserted into the fourth fastening hole AH4 of the second fixing area PA3b. By doing this, the base plate 161 and the first back cover 1010a and the second back cover 1010b may be coupled. It has been described that the first back cover 1010a and the second back cover 1010b are coupled by inserting the fixing protrusion of the base plate 161 into the fourth fastening hole AH4. However, the coupling method of the first back cover 1010a, the second back cover 1010b, and the second cover unit 160 is illustrative, and is not limited thereto.

In the display device 1000 according to another exemplary embodiment of the present disclosure, the back cover 1010 is configured by the first back cover 1010a and the second back cover 1010b which are separated to form the back cover 1010 so as to correspond to various sizes of the display panel 120. As the size of the display device 1000 is gradually increased, the size of the display panel 120 is also increased. In this case, the back cover 1010 needs to be larger than the display panel 120 to protect and support the display panel 120 so that a single back cover 1010 needs to be manufactured to be large. However, when the single back cover 1010 is manufactured to correspond to the large size display panel 120, there may be a difficulty in the manufacturing process. Therefore, in the display device 1000 according to another exemplary embodiment of the present disclosure, the back cover 1010 is configured by the first back cover 1010a and the second back cover 1010b and the first back cover 1010a and the second back cover 1010b may be coupled using the base plate 161 of the second cover unit 160. Accordingly, the first back cover 1010a and the second back cover 1010b may perform all the functions of the back cover 1010 of the related art and the back cover 1010 may be manufactured to be smaller so that the productivity of the back cover 1010 may be improved.

Referring to FIGS. 11 and 12A to 12C, the display unit DP may include a back cover 1010, a display panel 120, a flexible film 130, a printed circuit board 140, a first cover unit 150, and a second cover unit 160.

The back cover 1010 may be configured by the first back cover 1010a and the second back cover 1010b.

As described above, the back cover 1010 is disposed on a rear surface of the display panel 120 to support the display panel 120, the plurality of flexible films 130, and the printed circuit board 140. A size of the back cover 1010 may be larger than a size of the display panel 120. The back cover 1010 may protect other configurations of the display unit DP from the outside.

Even though the back cover 1010 is formed of a material having a rigidity, at least a part of the back cover 1010 may have a flexibility to be wound or unwound together with the display panel 120. For example, the back cover 1010 may be formed of a metal material such as steel use stainless (SUS) or invar or plastic. However, if the material of the back cover 1010 satisfies physical conditions such as a thermal strain amount, a radius of curvature, and a rigidity, the material may be diversely changed depending on the design, and is not limited thereto.

The back cover 1010 may include a plurality of support areas PA and a plurality of malleable areas MA. The plurality of support areas PA is an area where a plurality of openings 111 is not disposed and the plurality of malleable areas MA is an area where a plurality of openings 111 is disposed. Specifically, a first support area PA1, a first malleable area MA1, a second support area PA2, a second malleable area MA2, a first fixing area PA3a, a second fixing area PA3b, and a third malleable area MA3 are sequentially disposed from the uppermost end of the back cover 1010, but the present disclosure is not limited thereto.

Since the back cover 1010 is wound or unwound in a column direction, the plurality of support areas PA and the plurality of malleable areas MA may be disposed along the column direction.

The second support area PA2 is an area extending from the first malleable area MA1 to a lower side of the first back cover 1010a. The plurality of flexible films 130 which is coupled to one end of the display panel 120 may be disposed in the second support area PA2.

In the meantime, the first fixing area PA3a is an area corresponding to an upper portion of the third support area PA3 and the second fixing area PA3b is an area corresponding to a lower portion of the third support area PA3. The printed circuit board 140 may be disposed between the first fixing area PA3a and the second fixing area PA3b.

In order to protect the plurality of flexible films 130 and the printed circuit board 140, the second support area PA2, the first fixing area PA3a, and the second fixing area PA3b may support the plurality of flexible films 130 and the printed circuit board 140 to be maintained to be flat without being bent to the roller 171.

According to the present disclosure, when the first fixing area PA3a and the second fixing area PA3b are wound around the roller 171, a part of the outer circumferential surface of the roller 171 which is in contact with the first fixing area PA3a and the second fixing area PA3b may be configured by a flat surface, that is, a flat portion 171F. By doing this, the printed circuit board 140 is maintained to be flat without being bent to the roller 171. Further, according to the present disclosure, when the second support area PA2 is wound around the roller 171, an empty space may be formed between the first cover unit 150 and the second support area PA2 to reduce the interference of the plurality of flexible films 130. That is, the empty space is formed between the first cover unit 150 and the second support area PA2 so that even though the first cover unit 150 is wound around the roller 171, the first cover unit 150 and the flexible film 130 are not pressed by the wound display unit DP. Therefore, the flexible films 130 may be maintained to be flat and the interference of the flexible films 130 may be reduced. To this end, according to the present disclosure, the outer circumferential surface of the roller 171 is partially designed by an outer line of the first curved portion 171Ra and an inner line of the second curved portion 171Rb having a radius of curvature which is smaller than a radius of curvature of the outer line. Further, when the display unit DP is wound, the first cover unit 150 is wound so as to correspond to the second curved portion 171Rb.

That is, the second support area PA2, the first fixing area PA3a, and the second fixing area PA3b may be maintained to be flat regardless of being wound or unwound to the roller 171 and the plurality of flexible films 130 and the printed circuit board 140 disposed in the second support area PA2, the first fixing area PA3a, and the second fixing area PA3b may also be maintained to be flat.

The second malleable area MA2 is an area disposed between the second support area PA2 and the first fixing area PA3a. A plurality of openings 111 is disposed in the second malleable area MA2. The second malleable area MA2 is an area disposed between the second support area PA2 and the first fixing area PA3a to allow the second support area PA2 and the first fixing area PA3a to be wound around the flat portion 171F and the second curved portion 171Rb of the outer circumferential surface of the roller 171, respectively.

Further, the third malleable area MA3 is an area extending from the second fixing area PA3b to the lower side of the second back cover 1010b. A plurality of openings 111 is disposed in the third malleable area MA3. The third malleable area MA3 is an area extending to dispose the display area AA of the display panel 120 at the outside of the housing unit HP. That is, for example, when the back cover 1010 and the display panel 120 are fully unwound, an area from the fourth support area PA4 of the second back cover 1010b which is fixed to the roller 171 to the second support area PA2 in which the plurality of flexible films 130 is disposed may be disposed in the housing unit HP. The first malleable area MA1 to which the display panel 120 is attached and the first support area PA1 may be disposed at the outside of the housing unit HP. That is, when the display panel 120 is fully unwound, the fourth support area PA4 fixed to the roller 171, the second fixing area PA3b, the first fixing area PA3a, the second malleable area MA2, and the second support area PA2 extending from the fourth support area PA4 may be disposed in the housing unit HP.

The fourth support area PA4 is an area extending from the third malleable area MA3 to the lower side of the back cover 1010. The fourth support area PA4 is a lowermost area of the second back cover 1010b and is fastened with the roller 171. The fourth support area PA4 may include second fastening holes AH2 to be fastened with the roller 171. For example, screws which pass through the roller 171 and the second fastening holes AH2 are disposed to fasten the roller 171 and the fourth support area PA4 of the second back cover 1010b with each other. As the fourth support area PA4 is fastened with the roller 171, the back cover 1010 may be wound around or unwound from the roller 171. Even though two second fastening holes AH2 are illustrated in FIG. 10, the number of second fastening holes AH2 is not limited thereto.

As described above, according to the present disclosure, the second adhesive layer AD2 may not be applied to the routing line area RA and the pad area. According to the related art, the second adhesive layer is applied to the back cover and the front surface of the display panel so that when the back cover is wound around the roller, the display panel is wound around the roller. However, when the second adhesive layer AD2 is not applied to the routing line area RA and the pad area as described in the present disclosure, even though the back cover 110 which matches the corresponding section is wound around the roller 171, a part of the display panel 120, that is, the routing line area RA and the pad area may be maintained to be flat.

The widths of the routing line area RA and the pad area are approximately 10 mm and the second adhesive layer AD2 may not be applied only to the lower end of the display area AA so that the routing line area and the pad area are not visible with naked eyes from the front surface.

The second adhesive layer AD2 may include a double-sided adhesive tape.

As described above, the display unit DP according to the present disclosure may include a first cover unit 150 and a second cover unit 160.

The first cover unit 150 according to another exemplary embodiment of the present disclosure imparts a degree of freedom to the routing line area RA without compressing the display panel 120. Further, in order to reduce the interference of the flexible films 130, the first cover unit 150 may be configured with at least two divided chain structures including of a first chain cover plate 150a and a second chain cover plate 150b without having a base plate.

The first cover unit 150 is disposed in the second support area PA2 of the first back cover 1010a to accommodate the plurality of flexible films 130. The plurality of flexible films 130, a part of the first back cover 1010a corresponding to the plurality of flexible films 130, and an end of the display panel 120 coupled to the plurality of flexible films 130 may be covered by the first cover unit 150. The first cover unit 150 is disposed to cover the plurality of flexible films 130 to protect the plurality of flexible films 130. Further, according to the present disclosure, when the second support area PA2 is wound around the roller 171, an empty space may be formed between the first chain cover plate 150a of the first cover unit 150 and the second support area PA2 to reduce the interference of the plurality of flexible films 130. That is, the empty space is formed between the first chain cover plate 150a and the second support area PA2 so that even though the first cover unit 150 is wound around the roller 171 or further wound one more so that the display panel 120 is wound around the roller 171, the first cover unit 150 and the flexible films 130 are not pressed by the display unit DP.

Therefore, the flexible film 130 maintains a flat state and the interference of the flexible films 130 may be reduced. Further, the second chain cover plate 150b of the first cover unit 150 is disposed so as to cover one end of the display panel 120 to fix one end of the display panel 120 so as not to be loosened from the first back cover 1010a. The second chain cover plate 150b is disposed so as to cover one end of the display panel 120 to reduce the separation of the display panel 120 and the back cover 110 due to the repeated winding and unwinding of the display unit DP.

The first chain cover plate 150a and the second chain cover plate 150b may be disposed on one surface of the first back cover 1010a. The first chain cover plate 150a and the second chain cover plate 150b are disposed so as to cover the plurality of flexible films 130 and one end of the display panel 120 disposed on the second support area PA2 of the first back cover 1010a and may be formed to have a convex shape. That is, one surfaces of the first chain cover plate 150a and the second chain cover plate 150b may be formed as curved surfaces. The first chain cover plate 150a and the second chain cover plate 150b are formed of a material having a rigidity to protect one end of the display panel 120 and the plurality of flexible films 130, but is not limited thereto.

In the meantime, the first chain cover plate 150a and the second chain cover plate 150b may be coupled to each other. For example, a plurality of fixing holes H1 which passes through the first chain cover plate 150a and the second chain cover plate 150b is formed therein and a member such as a screw is fastened therewith through the plurality of fixing holes H1 so that the first chain cover plate 150a and the second chain cover plate 150b are coupled to each other.

However, the first chain cover plate 150a and the second chain cover plate 150b may be coupled to each other in various manners and are not limited thereto.

The second cover unit 160 is disposed from the first fixing area PA3a of the first back cover 1010a to the second fixing area PA3b of the second back cover 1010b to accommodate the printed circuit board 140. The printed circuit board 140 and a part of the first back cover 1010a and the second back cover 1010b corresponding to the printed circuit board 140 may be inserted into the second cover unit 160. The second cover unit 160 is disposed to cover the printed circuit board 140 to protect the printed circuit board 140.

The second cover unit 160 may include a base plate 161, a bottom plate 162, and a cover plate 163.

The base plate 161 may be disposed on an opposite surface of one surface of the first back cover 1010a and the second back cover 1010b. The base plate 161 may be fixed between the first fixing area PA3a and the second fixing area PA3b on an opposite surface of one surface of the first back cover 1010a and the second back cover 1010b on which the display panel 120 is not disposed. The base plate 161 and the printed circuit board 140 may be disposed so as to correspond to each other with the first back cover 1010a and the second back cover 1010b therebetween. Therefore, the base plate 161 may support the printed circuit board 140 together with the first fixing area PA3a and the second fixing area PA3b. For example, the base plate 161 is formed of a material having a rigidity to support from the first fixing area PA3a to the second fixing area PA3b to be flat, but is not limited thereto.

The bottom plate 162 may be disposed on one surface of the first back cover 1010a and the second back cover 1010b.

The bottom plate 162 may be disposed to support the printed circuit board 140 disposed on the first back cover 1010a and the second back cover 1010b. The bottom plate 162 may be disposed between the printed circuit board 140 and the first back cover 1010a and the second back cover 1010b. The bottom plate 162 may have a groove in which the printed circuit board 140 is seated so as not to move. That is, in the bottom plate 162, a portion where the printed circuit board 140 is seated may be concave. The groove may be referred to as a seating unit of the bottom plate 162 in which the printed circuit board 140 is seated. Therefore, the movement of the printed circuit board 140 disposed on the bottom plate 162 is reduced and the printed circuit board 140 may be stably disposed. However, the present disclosure is not limited thereto and the bottom plate 162 may be formed to be flat.

The cover plate 163 may be disposed on one surface of the first back cover 1010a and the second back cover 1010b.

The cover plate 163 may be disposed to cover the printed circuit board 140 disposed on the first back cover 1010a and the second back cover 1010b and have a convex shape. That is, one surface of the cover plate 163 may be formed as a curved surface. The cover plate 163 may be fixed to the base plate 161 on one surface of the first back cover 1010a and the second back cover 1010b on which the display panel 120 and the printed circuit board 140 are disposed. The cover plate 163 is formed of a material having a rigidity to protect the printed circuit board 140, but is not limited thereto.

In the meantime, the second cover unit 160 may be fixed to the first back cover 1010a and the second back cover 1010b.

The first cover unit 150 and the second cover unit 160 may be connected to each other. For example, a plurality of fixing holes H2 which passes through the first cover unit 150 and the second cover unit 160 is formed therein and a member such as a screw is fastened therewith through the plurality of fixing holes H2 so that the first cover unit 150 and the second cover unit 160 are coupled to each other. However, the first cover unit 150 and the second cover unit 160 may be coupled to each other by various methods, but are not limited thereto.

The first cover unit 150 and the second cover unit 160 maintain its original state without being bent when the display unit DP is wound to protect the plurality of flexible films 130 and the printed circuit board 140. Specifically, when the display unit DP is wound, the base plate 161 of the second cover unit 160 having the rigidity maintains a flat state without being bent to protect the printed circuit board 140. A part of the roller 171 around which the base plate 161 is wound may be formed as a flat surface so that the base plate 161 is not bent. For example, the roller 171 may be configured by the flat portion 171F and the first curved portion 171Ra and the second curved portion 171Rb and the base plate 161 is seated on the flat portion 171F. Therefore, even though the display unit DP is wound, the base plate 161 may be maintained to be flat without being bent. Further, as described above, the first cover unit 150 is configured with at least two separated chain structures of the first chain cover plate 150a and the second chain cover plate 150b to protect the flexible film 130 without compressing the display panel 120.

Next, when the display unit DP is wound, the first chain cover plate 150a and the second chain cover plate 150b of the first cover unit 150 and the cover plate 163 of the second cover unit 160 having a rigidity maintain its original convex shape without being deformed to protect the plurality of flexible films 130 and the printed circuit board 140. Further, the first chain cover plate 150a, the second chain cover plate 150b, and the cover plate 163 having a convex shape may form a substantially circular shape together with the first curved portion 171Ra and the second curved portion 171Rb of the roller 171. For example, the first chain cover plate 150a and the second chain cover plate 150b may form a substantial D shape. The base plate 161 having a flat shape and the cover plate 163 having a convex shape may form a substantial D shape. Further, the substantial D-shaped first cover unit 150 is seated on the second curved portion 171Rb of the roller 171 and the D-shaped second cover unit 160 is seated on the flat portion 171F of the roller 171 to form a substantial circular shape together with the first curved portion 171Ra and the second curved portion 171Rb of the roller 171. Accordingly, the first cover unit 150, the second cover unit 160, and the roller 171 form one substantial circular shape and a part of the display panel 120 which is wound on the first cover unit 150 and the second cover unit 160 may be wound with a larger radius of curvature. Therefore, a stress applied to the display panel 120 may be reduced.

As described above, the first chain cover plate 150a may protect the routing line area RA and the pad area of the display panel 120 and the second chain cover plate 150b may protect the flexible films 130. Further, the second cover unit 160 may protect the printed circuit board 140.

According to the present disclosure, the second chain cover plate 150b is not coupled to the display panel 120 and during the subsequent winding, the display unit DP does not press the second chain cover plate 150b to be flat so that the routing line area RA and the pad area of the display panel 120 may be protected.

According to the present disclosure, the first cover unit 150 is configured by at least two divided chain structure with the first chain cover plate 150a and the second chain cover plate 150b without having a base plate of the related art. Therefore, an empty space may be formed between the first cover unit 150 and the first back cover 1010a so that a degree of freedom of the plurality of flexible films 130 may be increased.

Fastening of Display Device

Figure 13A:
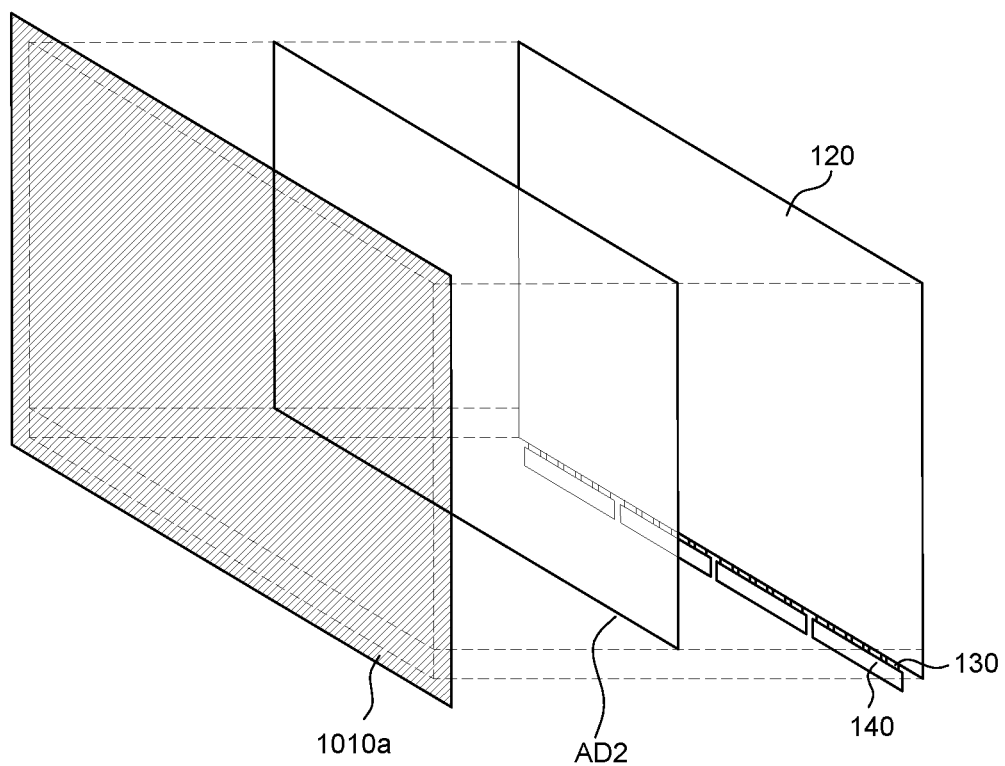
FIGS. 13A and 13B are perspective views illustrating the fastening of a first back cover and a display panel in a display device according to another exemplary embodiment of the present disclosure.
Figure 13B:
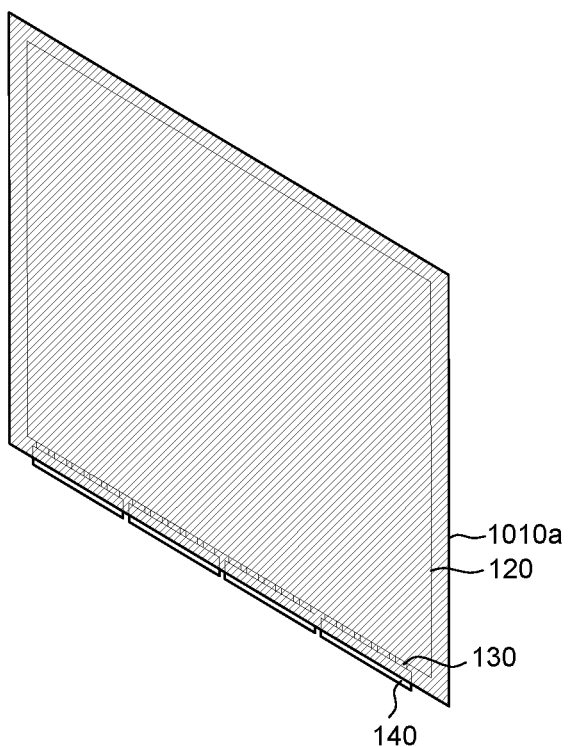

FIGS. 13A and 13B are perspective views illustrating the fastening of a first back cover and a display panel in a display device according to another exemplary embodiment of the present disclosure.

FIG. 13A illustrates a state before fastening the first back cover 1010a and the display panel 120 and FIG. 13B illustrates a state after fastening the first back cover 1010a and the display panel 120.

Referring to FIGS. 13A and 13B, when a screen direction in which an image is displayed is a right side, the first back cover 1010a may be fastened with the display panel 120 from the left side.

The plurality of flexible films 130 may be electrically connected to the display panel 120. A driving IC such as a gate driver IC or a data driver IC may be disposed on the plurality of flexible films 130.

Further, the printed circuit board 140 may be connected to the plurality of flexible films 130. The printed circuit board 140 is a component which supplies signals to the driving IC. Various components may be disposed in the printed circuit board 140 to supply various signals such as a driving signal or a data signal to the driving IC.

In this case, a second adhesive layer AD2 may be interposed between the first back cover 1010a and the display panel 120.

In the present disclosure, the second adhesive layer AD2 may not be applied to the routing line area RA and the pad area. According to the related art, the second adhesive layer is applied to the back cover and the front surface of the display panel so that when the back cover is wound around the roller, the display panel is wound around the roller. However, when the second adhesive layer AD2 is not applied to the routing line area RA and the pad area as described in the present disclosure, even though the first back cover 1010a which matches the corresponding section is wound around the roller 171, a part of the display panel, that is, the routing line area RA and the pad area may be maintained to be flat.

The widths of the routing line area RA and the pad area are approximately 10 mm and the second adhesive layer AD2 may not be applied only to the lower end of the display area AA so that the routing line area and the pad area are not visible with naked eyes from the front surface.

The second adhesive layer AD2 may include a double-sided adhesive tape.

Figure 14A:
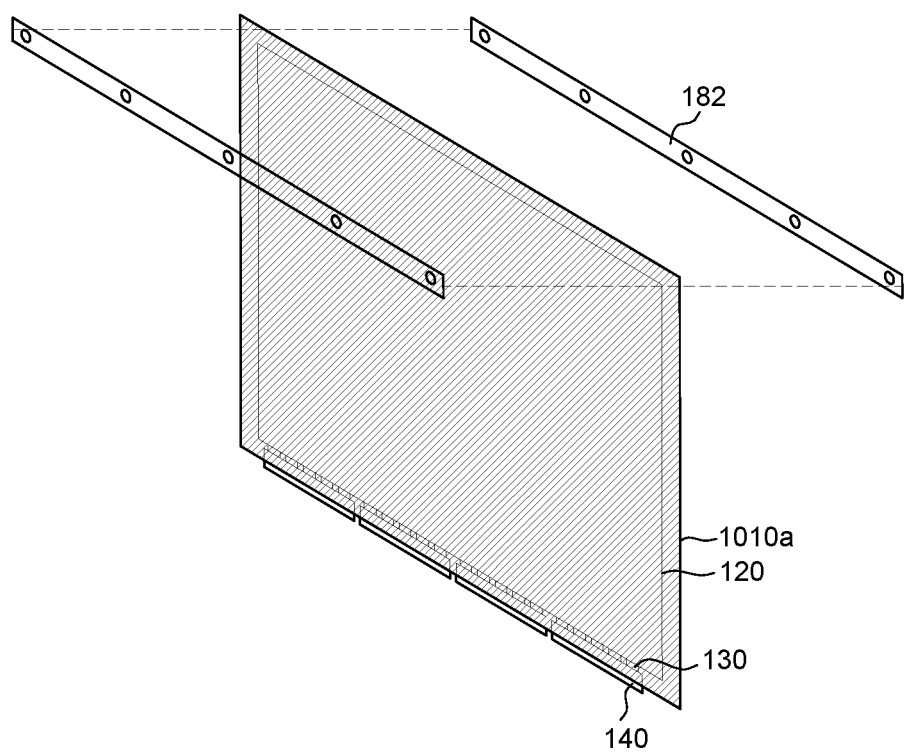
FIGS. 14A and 14B are perspective views illustrating the fastening of a first back cover and a head bar in a display device according to another exemplary embodiment of the present disclosure.
Figure 14B:
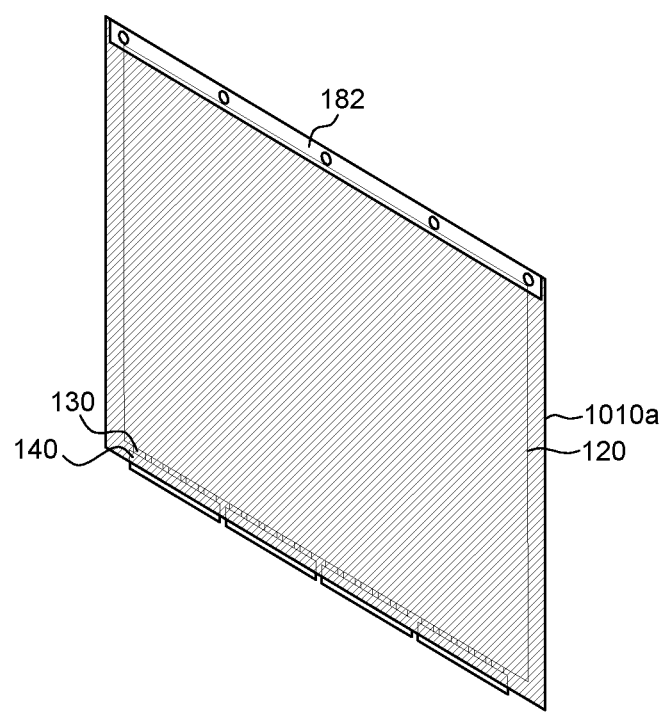

FIGS. 14A and 14B are perspective views illustrating the fastening of a first back cover and a head bar in a display device according to another exemplary embodiment of the present disclosure.

In this case, FIG. 14A illustrates a state before fastening the first back cover 1010a and the head bar 182 and FIG. 14B illustrates a state after fastening the first back cover 1010a and the head bar 182.

Referring to FIGS. 14A and 14B, after fastening the first back cover 1010a with the display panel 120, the head bar 182 may be fastened with the upper end of the first back cover 1010a.

The head bar 182 is coupled to the link unit 181 to move the display unit DP in the vertical direction in accordance with the rotation of the plurality of links 181a and 181b of the link unit 181. That is, the display unit DP may move in a vertical direction by the head bar 182 and the link unit 181.

The head bar 182 covers only a part of a surface which is adjacent to an uppermost edge of the display unit DP so as not to hide an image displayed on the top surface of the display unit DP. The display unit DP and the head bar 182 may be fixed by a screw, but are not limited thereto.

Figure 15:
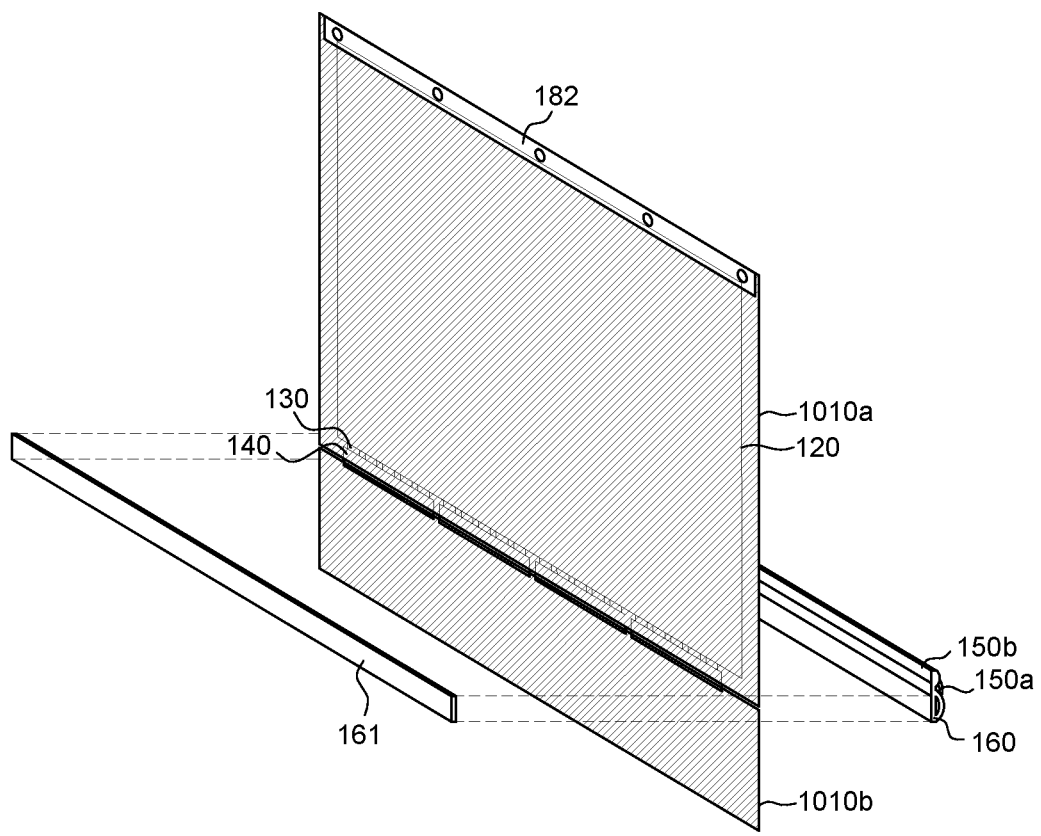
FIG. 15 is a perspective view illustrating the fastening of a second back cover and a first cover unit and a second cover unit in a display device according to another exemplary embodiment of the present disclosure.

FIG. 15 is a perspective view illustrating the fastening of a second back cover and a first cover unit and a second cover unit in a display device according to another exemplary embodiment of the present disclosure.

Referring to FIG. 15, after fastening the head bar 182 with an upper end of the first back cover 1010a, the first back cover 1010a and the second back cover 1010b may be fastened with the display unit DP through the first cover unit 150, the second cover unit 160, and the base plate 161.

In this case, the first cover unit 150 and the second cover unit 160 are fastened with one surfaces of the first back cover 1010a and the second back cover 1010b and the base plate 161 may be fastened with an opposite surface of one surfaces of the first back cover 1010a and the second back cover 1010b.

The first cover unit 150 is disposed in the second support area PA2 of the first back cover 1010a to accommodate the plurality of flexible films 130. The plurality of flexible films 130, a part of the first back cover 1010a corresponding to the plurality of flexible films 130, and an end of the display panel 120 coupled to the plurality of flexible films 130 may be covered by the first cover unit 150. The first cover unit 150 is disposed to cover the plurality of flexible films 130 to protect the plurality of flexible films 130. Further, according to the present disclosure, when the second support area PA2 is wound around the roller 171, an empty space may be formed between the first chain cover plate 150a of the first cover unit 150 and the second support area PA2 to reduce the interference of the plurality of flexible films 130. That is, the empty space is formed between the first chain cover plate 150a and the second support area PA2 so that even though the first cover unit 150 is wound around the roller 171 or further wound one more so that the display panel 120 is wound around the roller 171, the first cover unit 150 and the flexible films 130 are not pressed by the display unit DP. Therefore, the flexible film 130 maintains a flat state and the interference of the flexible films 130 may be reduced. Further, the second chain cover plate 150b of the first cover unit 150 is disposed so as to cover one end of the display panel 120 to fix one end of the display panel 120 so as not to be loosened from the first back cover 1010a. The second chain cover plate 150b is disposed so as to cover one end of the display panel 120 to reduce the separation of the display panel 120 and the first back cover 1010a due to the repeated winding and unwinding of the display unit DP.

The first chain cover plate 150a and the second chain cover plate 150b may be disposed on one surface of the first back cover 1010a. The first chain cover plate 150a and the second chain cover plate 150b are disposed so as to cover the plurality of flexible films 130 and one end of the display panel 120 disposed on the second support area PA2 of the first back cover 1010a and may be formed to have a convex shape. That is, one surface of the first chain cover plate 150a and one surface of the second chain cover plate 150b may each be formed as a curved surface. The first chain cover plate 150a and the second chain cover plate 150b are formed of a material having a rigidity to protect one end of the display panel 120 and the plurality of flexible films 130, but is not limited thereto.

The second cover unit 160 is disposed from the first fixing area PA3a of the first back cover 1010a to the second fixing area PA3b of the second back cover 1010b to accommodate the printed circuit board 140. The printed circuit board 140 and a part of the first back cover 1010a and the second back cover 1010b corresponding to the printed circuit board 140 may be inserted into the second cover unit 160. The second cover unit 160 is disposed to cover the printed circuit board 140 to protect the printed circuit board 140.

The second cover unit 160 may include a base plate 161, a bottom plate 162, and a cover plate 163.

The base plate 161 may be disposed on an opposite surface of one surface of the first back cover 1010a and the second back cover 1010b. The base plate 161 may be fixed between the first fixing area PA3a and the second fixing area PA3b on an opposite surface of one surface of the first back cover 1010a and the second back cover 1010b on which the display panel 120 is not disposed. The base plate 161 and the printed circuit board 140 may be disposed so as to correspond to each other with the first back cover 1010a and the second back cover 1010b therebetween. Therefore, the base plate 161 may support the printed circuit board 140 together with the first fixing area PA3a and the second fixing area PA3b. For example, the base plate 161 is formed of a material having a rigidity to support from the first fixing area PA3a to the second fixing area PA3b to be flat, but is not limited thereto.

Figure 16:
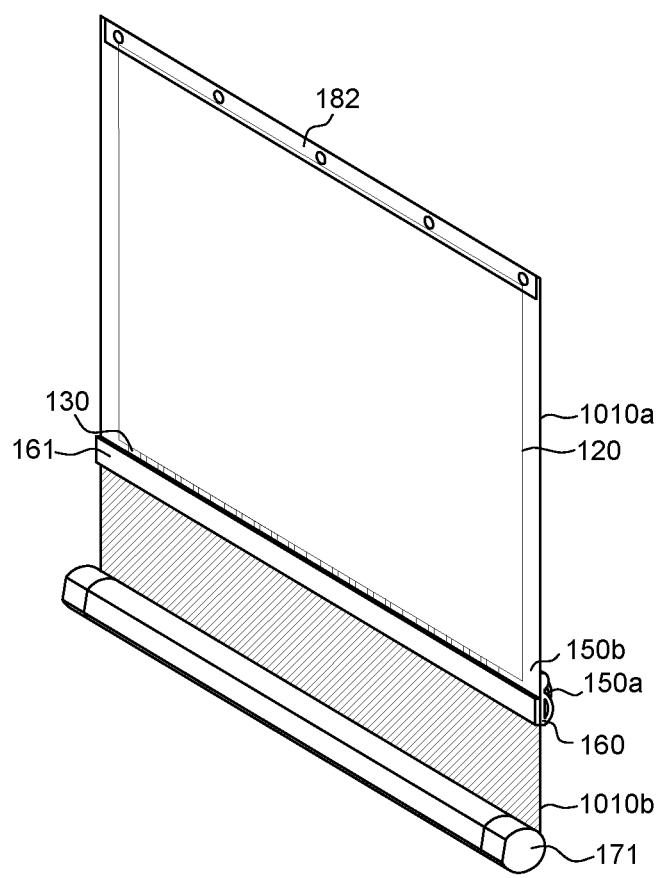
FIG. 16 is a perspective view illustrating the fastening of a second back cover and a roller in a display device according to another exemplary embodiment of the present disclosure.

FIG. 16 is a perspective view illustrating the fastening of a second back cover and a roller in a display device according to another exemplary embodiment of the present disclosure.

Referring to FIG. 16, after fastening the first cover unit 150 and the second cover unit 160 with the first back cover 1010a and the second back cover 1010b, the roller 171 according to the present disclosure may be fastened with a lower end of the second back cover 1010b.

The second back cover 1010*b* includes a second fixing area PA3*b*, the third malleable area MA3, and the fourth support area PA4.

The fourth support area PA4 is an area extending from the third malleable area MA3 to the lower side of the back cover 1010. The fourth support area PA4 is a lowermost area of the second back cover 1010*b* and is fastened with the roller 171. The fourth support area PA4 may include second fastening holes AH2 to be fastened with the roller 171. For example, screws which pass through the roller 171 and the second fastening holes AH2 are disposed to fasten the roller 171 and the fourth support area PA4 of the second back cover 1010*b* with each other. As the fourth support area PA4 is fastened with the roller 171, the back cover 1010 may be wound around or unwound from the roller 171.

The exemplary embodiments of the present disclosure can also be described as follows:

According to an aspect of the present disclosure, there is provided a display device. The display device includes a display panel, a back cover which supports the display panel on a rear surface of the display panel, a plurality of flexible films which is electrically connected to one end of the display panel and is disposed on one surface of the back cover, a printed circuit board which is electrically connected to the plurality of flexible films and disposed on the one surface of the back cover and a roller to which the display panel and the back cover are wound or unwound, the roller including a flat portion and a first curved portion and a second curved portion having different radii of curvature.

The display device may further include a first cover unit which accommodates the plurality of flexible films and a second cover unit which accommodates the printed circuit board.

When the display panel is wound, the second cover unit may be seated in the flat portion and the first cover unit may be seated in the first curved portion.

The display device may further include an adhesive layer which is interposed between the display panel and the back cover to bond the display panel and the back cover, wherein the adhesive layer may be disposed before a routing line area located at one end of the display panel from the other end of the display panel.

Even though the back cover is wound around the roller, the routing line area and a pad area of the display panel may maintain a flat state.

The first cover unit may be configured by a first chain cover plate and a second chain cover plate.

The second cover unit may include a base plate which is fixed to the back cover on an opposite surface of the one surface of the back cover and a cover plate which covers the printed circuit board, on the one surface of the back cover.

One surfaces of the first chain cover plate, the second chain cover plate, and the cover plate may be configured by curved surfaces.

The second cover unit may further include a bottom plate disposed between the printed circuit board and the back cover.

The back cover may include a plurality of support areas having a rigidity and a plurality of malleable areas having a flexibility.

The plurality of support areas may be areas of the back cover in which a plurality of openings are not disposed, and the plurality of malleable areas may be areas of the back cover in which a plurality of openings are disposed.

The first cover unit may be disposed to correspond to one support area of the back cover and the second cover unit may be disposed to correspond to the other support area of the back cover.

An empty space may be formed between the first cover unit and the one support area of the back cover and the plurality of flexible films may be disposed in the empty space.

The back cover may include a first back cover on which the display panel and the plurality of flexible films are disposed and a second back cover which is disposed to be spaced apart from the first back cover and has one end fixed to the roller, and one end of the second cover unit may be connected to the first back cover and the other end of the second cover unit may be connected to the second back cover.

According to another aspect of the present disclosure, there is provided a display device. The display device includes a display panel, a plurality of flexible films which is electrically connected to the display panel, a printed circuit board which is electrically connected to the plurality of flexible films, a back cover which supports the display panel, the plurality of flexible films, and the printed circuit board and includes a plurality of openings, a first cover unit which covers the plurality of flexible films and a part of the back cover and a part of the display panel corresponding to the plurality of flexible films, a second cover unit which covers the printed circuit board and the other part of the back cover corresponding to the printed circuit board and a roller to which the display panel and the back cover are wound or unwound, the roller including a flat portion, a first curved portion, and a second curved portion, wherein even though the back cover may be wound around the roller, a routing line area at a lower end of the display panel may maintain a flat state.

The display device may further include an adhesive layer which is interposed between the display panel and the back cover to bond the display panel and the back cover, wherein the adhesive layer may be disposed before the routing line area located at one end of the display panel from the other end of the display panel.

When the display panel is wound, the second cover unit may be seated in the flat portion and the first cover unit may be seated in the first curved portion.

The first cover unit may be configured by a first chain cover plate and a second chain cover plate.

An empty space may be formed between the first cover unit and a support area of the back cover and the plurality of flexible films may be disposed in the empty space.

The back cover may include a first back cover on which the display panel and the plurality of flexible films are disposed and a second back cover which is disposed to be spaced apart from the first back cover and has one end fixed to the roller, and one end of the second cover unit may be connected to the first back cover and the other end of the second cover unit may be connected to the second back cover.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a display panel;
a back cover which supports the display panel on a rear surface of the display panel;
a plurality of flexible films which is electrically connected to one end of the display panel and is disposed on one surface of the back cover;
a printed circuit board which is electrically connected to the plurality of flexible films and disposed on the one surface of the back cover; and
a roller to which the display panel and the back cover are wound or unwound, the roller including a flat portion and a first curved portion and a second curved portion having different radii of curvature.

2. The display device according to claim 1, further comprising:
a first cover unit which accommodates the plurality of flexible films; and
a second cover unit which accommodates the printed circuit board.

3. The display device according to claim 2, wherein when the display panel is wound, the second cover unit is seated in the flat portion and the first cover unit is seated in the first curved portion.

4. The display device according to claim 1, further comprising:
an adhesive layer which is interposed between the display panel and the back cover to bond the display panel and the back cover,
wherein the adhesive layer is disposed before a routing line area located at one end of the display panel from another end of the display panel.

5. The display device according to claim 4, wherein even though the back cover is wound around the roller, the routing line area and the pad area of the display panel maintain a flat state.

6. The display device according to claim 2, wherein the first cover unit is configured by a first chain cover plate and a second chain cover plate.

7. The display device according to claim 6, wherein the second cover unit includes:
a base plate which is fixed to the back cover on an opposite surface of the one surface of the back cover; and
a cover plate which covers the printed circuit board, on the one surface of the back cover.

8. The display device according to claim 7, wherein one surfaces of the first chain cover plate, the second chain cover plate, and the cover plate are configured by curved surfaces.

9. The display device according to claim 7, wherein the second cover unit further includes a bottom plate disposed between the printed circuit board and the back cover.

10. The display device according to claim 2, wherein the back cover includes a plurality of support areas having a rigidity and a plurality of malleable areas having a flexibility.

11. The display device according to claim 10, wherein the plurality of support areas are areas of the back cover in which a plurality of openings are not disposed and the plurality of malleable areas are areas of the back cover in which a plurality of openings are disposed.

12. The display device according to claim 10, wherein the first cover unit is disposed to correspond to one support area of the back cover and the second cover unit is disposed to correspond to another support area of the back cover.

13. The display device according to claim 12, wherein an empty space is formed between the first cover unit and the support area of the back cover and the plurality of flexible films are disposed in the empty space.

14. The display device according to claim 1, wherein the back cover includes:
a first back cover on which the display panel and the plurality of flexible films are disposed; and
a second back cover which is disposed to be spaced apart from the first back cover and has one end fixed to the roller, and
wherein one end of the second cover unit is connected to the first back cover and another end of the second cover unit is connected to the second back cover.

15. A display device, comprising:
a display panel;
a plurality of flexible films which is electrically connected to the display panel;
a printed circuit board which is electrically connected to the plurality of flexible films;
a back cover which supports the display panel, the plurality of flexible films, and the printed circuit board and includes a plurality of openings;
a first cover unit which covers the plurality of flexible films and a part of the back cover and a part of the display panel corresponding to the plurality of flexible films;
a second cover unit which covers the printed circuit board and another part of the back cover corresponding to the printed circuit board; and
a roller to which the display panel and the back cover are wound or unwound, the roller including a flat portion, a first curved portion, and a second curved portion,
wherein even though the back cover is wound around the roller, a routing line area at a lower end of the display panel maintains a flat state.

16. The display device according to claim 15, further comprising:
an adhesive layer which is interposed between the display panel and the back cover to bond the display panel and the back cover,
wherein the adhesive layer is disposed before the routing line area located at one end of the display panel from the other end of the display panel.

17. The display device according to claim 15, wherein when the display panel is wound, the second cover unit is seated in the flat portion and the first cover unit is seated in the first curved portion.

18. The display device according to claim 15, wherein the first cover unit is configured by a first chain cover plate and a second chain cover plate.

19. The display device according to claim 15, wherein an empty space is formed between the first cover unit and a support area of the back cover and the plurality of flexible films is disposed in the empty space.

20. The display device according to claim 15, wherein the back cover includes:
a first back cover on which the display panel and the plurality of flexible films are disposed; and a second back cover which is disposed to be spaced apart from the first back cover and has one end fixed to the roller, and wherein one end of the second cover unit is connected to the first back cover and the other end of the second cover unit is connected to the second back cover.

* * * * *